United States Patent
Bickford et al.

(10) Patent No.: US 8,855,954 B1
(45) Date of Patent: Oct. 7, 2014

(54) SYSTEM AND METHOD FOR PROGNOSTICATING CAPACITY LIFE AND CYCLE LIFE OF A BATTERY ASSET

(75) Inventors: Randall L. Bickford, Orangevale, CA (US); Dustin R. Garvey, Houston, TX (US)

(73) Assignee: Intellectual Assets LLC, Lake Tahoe, NV (US)

( * ) Notice: Subject to any disclaimer, the term of this patent is extended or adjusted under 35 U.S.C. 154(b) by 1178 days.

(21) Appl. No.: 12/660,046

(22) Filed: Feb. 19, 2010

Related U.S. Application Data

(63) Continuation-in-part of application No. 12/315,117, filed on Nov. 28, 2008, and a continuation-in-part of application No. 12/315,137, filed on Nov. 28, 2008, now Pat. No. 8,271,421.

(60) Provisional application No. 61/005,057, filed on Nov. 30, 2007, provisional application No. 61/004,839, filed on Nov. 30, 2007.

(51) Int. Cl.
*G01R 31/36* (2006.01)
(52) U.S. Cl.
USPC .......................................................... 702/63
(58) Field of Classification Search
USPC .......................................................... 702/63
See application file for complete search history.

(56) References Cited

U.S. PATENT DOCUMENTS

| | | | |
|---|---|---|---|
| 4,519,040 A | 5/1985 | Brankamp et al. | |
| 5,210,704 A | 5/1993 | Husseiny | |
| 5,270,222 A | 12/1993 | Moslehi | |
| 6,006,154 A | 12/1999 | Wang | |
| 6,215,312 B1 | 4/2001 | Hoenig et al. | |
| 6,411,908 B1* | 6/2002 | Talbott | 702/34 |
| 6,442,511 B1 | 8/2002 | Sarangapani et al. | |
| 6,542,852 B2 | 4/2003 | Chen et al. | |
| 6,665,425 B1 | 12/2003 | Sampath et al. | |
| 6,782,345 B1 | 8/2004 | Siegel et al. | |
| 6,892,317 B1 | 5/2005 | Sampath et al. | |
| 7,027,953 B2 | 4/2006 | Klein | |
| 7,227,335 B2 | 6/2007 | Sakakibara et al. | |
| 7,245,107 B2 | 7/2007 | Moore et al. | |
| 2005/0149280 A1* | 7/2005 | Sharma et al. | 702/63 |
| 2006/0284617 A1 | 12/2006 | Kozlowski et al. | |

OTHER PUBLICATIONS

Lu, J.C, et al, "Using Degradation Measures to Measure Time-To-Failure Distribution", Technometrics, vol. 35, No. 2, pp. 161-174, May 1993.

Upadhyaya, B.R., et al, "Residual Life Estimation of Plant Components," P/PM Technology, vol. 7, No. 3, pp. 22-29, 1994.

Brotherton, T., et al, "Prognosis of Faults in Gas Turbine Engines", Proceedings of the IEEE Aerospace Conference, vol. 6, pp. 163-171: Mar. 18-25, 2000.

(Continued)

*Primary Examiner* — Stephen Cherry
(74) *Attorney, Agent, or Firm* — Dennis A. DeBoo

(57) ABSTRACT

Path classification and estimation method and system used in combination with a computer and memory for prognosticating the remaining useful life of an in-service battery asset by classifying a present degradation path of the in-service battery asset as belonging to one or more of previously collected degradation paths of one or more exemplary battery assets and using the resulting classifications to estimate the remaining useful life of the in-service battery asset thereby transforming raw data inputs into actionable state-of-health outputs.

24 Claims, 22 Drawing Sheets

(56) References Cited

OTHER PUBLICATIONS

Jagannathan, S. and G. V. S. Raju, "Remaining Useful Life Prediction of Automotive Engine Oils Using MEMS Technologies", Proceedings of the American Control Conference, vol. 5, pp. 3511-3512: Jun. 28-30, 2000.

Swanson, D.C., "A General Prognostic Tracking Algorithm for Predictive Maintenance", Proceedings of the IEEE Aerospace Conference, vol. 6, pp. 2971-2977: Mar. 10-17, 2001.

Roemer, M.J., et al, "Assessment of Data and Knowledge Fusion for Prognostics and Health Management", Proceedings of the IEEE Aerospace Conference, vol. 6, pp. 2979-2988: Mar. 10-17, 2001.

Roemer, M.J., et al, "Development of Diagnostic and Prognostic Technologies for Aerospace Health Management Applications", Proceedings of the IEEE Aerospace Conference, vol. 6, pp. 3139-3147: Mar. 10-17, 2001.

Roemer, M.J., et al, "Improved Diagnostic and Prognostic Assessments Using Health Management Information Fusion", Proceedings of the IEEE Systems Readiness Technology Conference, pp. 365-377: Aug. 20-23, 2001.

Bonissone, P. and K. Goebel, "When will it break? A Hybrid Soft Computing Model to Predict Time-to-break Margins in Paper Machines", Proc. SPIE 2002, pp. 53-64, Aug. 2002, Seattle, WA.

Loecher, M. and C. Darken, "Concurrent estimation of time-to-failure and effective wear", Proceedings of the Maintenance and Reliability Conference (MARCON) 2003.

Pecht, M, et al, "Life consumption monitoring for electronics prognostics", Proceedings of the IEEE Aerospace Conference, vol. 5, pp. 3455-3467: Mar. 6-13, 2004.

Byington, C.S., et al, "Data-Driven Neural Network Methodology to Remaining Life Predictions for Aircraft Actuator Components", Proceedings of the IEEE Aerospace Conference, vol. 6, pp. 3581-3589: Mar. 6-13, 2004.

Wang, W.Q., et al, "Prognosis of Machine Health Condition Using Neuro-Fuzzy Systems", Mechanical Systems and Signal Processing, vol. 18, pp. 813-831: Jul. 2004.

Pecht, M, et al, "In Situ Temperature Measurement of a Notebook Computer—A Case Study in Health and Usage Monitoring of Electronics", IEEE Transactions on Device and Materials Reliability, vol. 4, Issue. 4, pp. 658-663: Dec. 2004.

Yan, J., et al, "A Prognostic Algorithm for Machine Performance Assessment and its Application", Production Planning and Control, vol. 15, No. 8, pp. 796-801: Dec. 2004.

Zhao, W., et al, "Reliability Prediction Using Multivariate Degradation Data," RAMS '05, pp. 337-341, Jan. 24-27, 2005.

Bonissone, P.P. and A. Varma, "Predicting the Best Units within a Fleet: Prognostic Capabilities Enabled by Peer Learning, Fuzzy Similarity, and Evolutionary Design Process", Proceedings of the 14th IEEE International Conference on Fuzzy Systems, pp. 312-318: May 22-25, 2005.

Del Amo, A., et al, "General Reasoning System for Health Management", Proceedings of the Annual Meeting of the North American Fuzzy Information Processing Society, pp. 19-24: Jun. 26-28, 2005.

Goebel, K. and P. Bonissone, "Prognostic Information Fusion for Constant Load Systems", Proceedings of the 8th International Conference on Information Fusion, vol. 2, pp. 1247-1255: Jul. 25-28, 2005.

Liao, H., et al, "Predicting Remaining Useful Life of an Individual Unit Using Proportional Hazards Model and Logistic Regression Model", RAMS '06, pp. 127-132: Jan. 23-26, 2006.

Pecht, M, et al, "Prognostics and health management of electronics", IEEE Transactions on Components and Packaging Technologies, vol. 29, Issue. 1, pp. 222-229: Mar. 2006.

Wang, P., et al, "Reliability and Degradation Modeling with Random or Uncertain Failure Threshold", RAMS '07, pp. 392-397: Jan. 22-25, 2007.

Rufus, F., et al, "Health Monitoring Algorithms for Space Application Batteries", Intl. Conf. on Prognostics and Health Management, PHM 2008: Oct. 6-9, 2008.

Tang, X., et al, "Modeling and Estimation of Nickel Metal Hydride Battery Hysteresis for SOC Estimation", Intl. Conf. on Prognostics and Health Management, PHM 2008: Oct. 6-9, 2008.

Singh, P., et al, "Fuzzy Logic-Based Smart Battery State-of-Charge (SOC) Monitor for Automotive Batteries," SAE Technical Paper 2004-01-1584, 2004.

Dubarry, M., et al., "Capacity and power fading mechanism identification from a commercial cell evaluation," J. Power Sources, 165, 566: 2007.

Liaw, B.Y., et al, "Modeling capacity fade in lithium-ion cells," J. Power Sources, 140, 157-161: 2005.

Dubarry, M., et al, "Incremental Capacity Analysis and Close-to-Equilibrium OCV Measurements to Quantify Capacity Fade in Commercial Rechargeable Lithium Batteries," Electrochem. Solid-State Lett., 9, A454: 2006.

* cited by examiner

```
┌─────────────────────────────────────────────────────────────────────────┐
│ A computer-implemented method for estimating a battery discharge remaining │
│ useful life (Capacity RUL) of an observed or in-service battery asset, the │
│ method comprising the steps of:                                         │
└─────────────────────────────────────────────────────────────────────────┘
                                    │
                                    ▼
┌─────────────────────────────────────────────────────────────────────────┐
│ Obtaining exemplar battery discharge voltage data from at least one example │
│ battery asset;                                                          │
└─────────────────────────────────────────────────────────────────────────┘
                                    │
                                    ▼
┌─────────────────────────────────────────────────────────────────────────┐
│ Transforming the exemplar battery discharge voltage data into functional │
│ approximations defining exemplar battery discharge voltage paths;       │
└─────────────────────────────────────────────────────────────────────────┘
                                    │
                                    ▼
┌─────────────────────────────────────────────────────────────────────────┐
│ Acquiring observed battery discharge voltage data from an in-service battery │
│ asset;                                                                  │
└─────────────────────────────────────────────────────────────────────────┘
                                    │
                                    ▼
┌─────────────────────────────────────────────────────────────────────────┐
│ Transforming the observed battery discharge voltage data into an observed │
│ functional approximation defining an observed battery discharge voltage path; │
└─────────────────────────────────────────────────────────────────────────┘
                                    │
                                    ▼
┌─────────────────────────────────────────────────────────────────────────┐
│ Classifying the observed battery discharge voltage data by determining a │
│ plurality of similarities each quantifying a degree of similarity of the observed │
│ battery discharge voltage path to at least one of the exemplar battery  │
│ discharge voltage paths; and                                            │
└─────────────────────────────────────────────────────────────────────────┘
                                    │
                                    ▼
┌─────────────────────────────────────────────────────────────────────────┐
│ Estimating a discharge remaining useful life (Capacity RUL) of the observed │
│ or in-service battery asset using the determined plurality of similarities. │
└─────────────────────────────────────────────────────────────────────────┘
```

FIG. 12

| | $a + bt + ct^2 + dt^3$ | | | |
|---|---|---|---|---|
| $A/A_{max}$ | a | b | c | d |
| 0.05 | 1.2173 | -0.0003 | 3.7641E-7 | -2.4908E-10 |
| 0.10 | 1.2147 | -0.0006 | 1.4470E-6 | -1.8761E-9 |
| 0.25 | 1.1966 | -0.0015 | 8.5852E-6 | -2.8323E-8 |
| 0.50 | 1.1742 | -0.0025 | 2.5150E-5 | -1.5112E-7 |
| 1.00 | 1.1473 | -0.0050 | 0.0001 | -1.0870E-6 |

| A/A$_{max}$ | Amps Discharged / A$_{max}$ |
|---|---|
| 0.05 | 61.1 |
| 0.10 | 61.2 |
| 0.25 | 57.9 |
| 0.50 | 54.6 |
| 1.00 | 49.1 |

SYSTEM AND METHOD FOR PROGNOSTICATING CAPACITY LIFE AND CYCLE LIFE OF A BATTERY ASSET

CROSS-REFERENCE TO RELATED APPLICATIONS

This application is a continuation-in-part patent application of (1) U.S. application Ser. No. 12/315,117, entitled "Path Classification and Estimation Method and System for Prognosticating Asset Life," filed Nov. 28, 2008, currently pending, and which claims priority to U.S. Provisional Patent Application No. 61/005,057, filed Nov. 30, 2007; and (2) U.S. application Ser. No. 12/315,137, entitled "Nonparametric Fuzzy Inference System and Method," filed Nov. 28, 2008, now U.S. Pat. No. 8,271,421, and which claims priority to U.S. Provisional Patent Application No. 61/004,839, filed Nov. 30, 2007; all four disclosures of which are incorporated herein by reference in their entireties.

This application is also related to (1) U.S. application Ser. No. 11/179,242, entitled "Asset Surveillance Method and System having Similarity Model Estimation," filed Jul. 12, 2005, currently pending; and to (2) U.S. application Ser. No. 12/315,118, entitled "Asset Surveillance System and Method Comprising Self-Calibrating Fault Detection," filed Nov. 28, 2008, currently pending; both disclosures of which are incorporated herein by reference in their entireties.

STATEMENT REGARDING FEDERALLY SPONSORED RESEARCH AND DEVELOPMENT

This invention was made with Government support under Office of Naval Research Contract No. N00014-07-M-0414 awarded by the United States Navy and is subject to the provisions of Public Law 96-517 (35 USC 202) and the Code of Federal Regulations 48 CFR 52.227-11, in which the contractor has elected to retain title. The Government has certain rights in the invention.

FIELD OF THE INVENTION

This invention relates generally to a system and method for battery capacity life and cycle life determination, and in particular, to a path classification and estimation (PACE) system and method for prognosticating a capacity remaining useful life (Capacity RUL) and a cycle remaining useful life (Cycle RUL) of a battery asset.

BACKGROUND OF THE INVENTION

Products useful for determining or monitoring the condition or remaining useful life of productive assets, including but not limited to batteries used in military aircraft, most often perform this surveillance function by evaluating signal or data values obtained during asset operation. One means for determining or monitoring the condition of an asset involves estimating the expected data values and comparing the estimated values to current or present data values obtained from the asset. When the estimated data values characterize the desired or expected operation of the asset, a disagreement between the estimated data values and the present data values provides a sensitive and reliable indication of an asset degradation or fault condition and can further provide an indication of the particular cause and severity of the asset degradation or fault. The disagreement between each estimated data value and each present data value can be computed as the numerical difference between them. This difference is often referred to as a residual data value. The residual data values, the present data values, or the estimated data values can be used to determine condition of the asset and to identify or diagnose asset degradation or fault conditions.

In recent years, the field of prognostics has reached buzzword status. The result of which has been an avalanche of literature describing many different prognostic algorithms that are supposedly capable of estimating the remaining useful life (RUL) of an individual asset. However, upon closer examination, it is evident that the current state of the art is cluttered with methods that either do not produce estimates of the RUL or do not provide a realistic method for relating degradation to the RUL for an in-service asset, such as military aircraft batteries.

For example, a general path model (GPM) (Lu, C. Joseph and William Q. Meeker, "Using Degradation Measures to Estimate a Time-to-Failure Distribution", *Technometrics*, Vol. 35, No. 2, pp. 161-174: May 1993.) is founded on the concept that a degradation signal collected from an individual asset will follow a general path until it reaches an associated failure threshold. Since its introduction, the thought model proposed in the GPM has been prolifically adopted by modern researchers and has resulted in a plethora of techniques that can be related to the GPM in one way or another.

There are two fundamental assumptions of the GPM and its modern counterparts. First, there exists a path for the degradation signal that can be parameterized via regression, machine learning, et cetera and secondly, there exists a failure threshold for the degradation signal that accurately predicts when an asset will fail. For modern computational capacity, the first assumption is minor, in that many methods exist for parameterizing simple (polynomial regression, power regression, et cetera) and complex (fuzzy inference systems, neural networks, et cetera) relationships from data. The assumption of the existence of a threshold that accurately predicts asset failure is not so easily reconciled. While the existence of a failure threshold has been shown to be valid for well understood degradation processes (for example, seeded crack growth) and controlled testing environments (for example, constant load or uniform cycling), Liao observes that for real world applications, where the failure modes are not always well understood or can be too complex to be quantified by a single threshold, the failure boundary is vague at best (Liao, Haitao, Wenbiao Zhao, and Huairui Guo, "Predicting Remaining Useful Life of an Individual Unit Using Proportional Hazards Model and Logistic Regression Model", *Proceedings of the Reliability and Maintainability Symposium (RAMS)*, pages 127-132: Jan. 23-26, 2006). Wang, et al. attempt to address this problem by integrating uncertainty into the estimate of the threshold (Wang, Peng and David W. Coit, "Reliability and Degradation Modeling with Random or Uncertain Failure Threshold", *Proceedings of the Annual Reliability and Maintainability Symposium*, Las Vegas, Nev.: Jan. 28-31, 2007), but in the end the authors replace an estimate of the threshold with another, more conservative estimate.

For the most part modern prognostic methods have failed to actually produce estimates of the RUL; however, it is important to note that there are methods available that actually estimate the RUL of an individual asset. For example, most notably Bonissone, et al. (Bonissone, P. and K. Goebel (2002), "When Will It Break? A Hybrid Soft Computing Model to Predict Time-to-Break Margins in Paper Machines", *Proceedings of SPIE 47$_{th}$ Annual Meeting, International Symposium on Optical Science and Technology*, Vol. 4785, pages 53-64: 2002) use a complex system involving many statistical and artificial intelligence based methods to infer the RUL of a paper machine. However, the sheer complexity and poor estimate accuracy limited the applicability of this work to an academic forum.

Hence, there is a need for a system and method for prognosticating the remaining useful life (RUL) of an asset, such as batteries used in military aircraft, that ameliorates or overcomes one or more of the shortcomings of the known prior art.

BRIEF SUMMARY OF THE INVENTION

Accordingly, and in one aspect, an embodiment of the invention ameliorates or overcomes one or more of the shortcomings of the known prior art by providing a path classification and estimation (PACE) system and method for prognosticating a remaining useful life (RUL) of a battery. In one embodiment, battery prognostics are comprised of two kinds of remaining useful life measures or determinations. One measure or determination of remaining useful life is a time for which a battery can be used for a present or observed charge (Capacity RUL) and another measure or determination of remaining useful life is a number of charge/discharge cycles for which a battery can be used before being replaced (Cycle RUL).

In general, and in one aspect, an embodiment of the invention provides a path classification and estimation (PACE) system and method for prognosticating a remaining useful battery present charge life (Capacity RUL) or service life (Cycle RUL) of an individual battery asset by performing two main operations to estimate the remaining useful capacity life or cycle life of the individual battery asset, namely classification and estimation. First, degradation of the individual battery asset is classified according to expected/example battery capacity life degradations or cycle life degradations. Second, the remaining useful battery capacity life or cycle life of the individual battery asset is estimated by utilizing memberships resulting from the classification.

More particularly, and in one aspect, an embodiment of the invention provides a path classification and estimation (PACE) method and system for prognosticating a remaining useful battery capacity life or cycle life for an observed or in-service battery asset wherein observations of the individual battery's capacity life or cycle life degradation are classified according to one or more previously acquired examples of capacity life or cycle life degradations and the result of the classification is used to estimate the remaining useful capacity life or cycle life of the observed or in-service battery asset. Hence, an embodiment of the invention provides a prognostic system and method that provides accurate estimates of the RUL of an observed or in-service battery asset in different contexts.

In a further aspect, an embodiment of the invention provides a computer-implemented method for prognosticating a remaining useful life of an observed battery asset, said method comprising the steps of: providing at least one prognostic model comprised of a plurality of degradation data paths correlative to degrading or failing operation of at least one exemplary battery asset; acquiring observed battery degradation data from an observed battery asset; transforming the observed battery degradation data into an acquired data path; computing a similarity between the acquired data path and at least one of the plurality of degradation data paths; classifying the observed battery degradation data as a function of at least one computed similarity between the acquired data path and at least one of the plurality of degradation data paths; and estimating a remaining useful life of the observed battery asset using results of the classification step. Additionally, an embodiment of the invention provides a computer-readable medium having computer executable instructions recorded thereon which causes, in use, a computer running the instructions to execute a procedure according to the above computer-implemented method. Furthermore, an embodiment of the invention provides a system comprised of means for accomplishing the steps of the above method.

In a further aspect, an embodiment of the invention provides a computer-implemented method for estimating a remaining useful life of an observed battery asset, comprising the steps of: obtaining exemplar degradation data from at least one exemplar battery asset; transforming the exemplar degradation data into functional approximations defining exemplar degradation paths; acquiring observed battery asset degradation data from an observed battery asset; transforming the observed battery asset degradation data into a functional approximation defining an observed battery asset degradation path; classifying the observed battery asset degradation data by determining a plurality of similarities each quantifying a degree of similarity of the observed battery asset degradation path to at least one of the exemplar degradation paths; and estimating a remaining useful life of the observed battery asset using the determined plurality of similarities. Additionally, an embodiment of the invention provides a computer-readable medium having computer executable instructions recorded thereon which causes, in use, a computer running the instructions to execute a procedure according to the above computer-implemented method. Furthermore, an embodiment of the invention provides a system comprised of means for accomplishing the steps of the above method.

Accordingly, it should be apparent that numerous modifications and adaptations may be resorted to without departing from the scope and fair meaning of the claims as set forth herein below following the detailed description of the invention.

BRIEF DESCRIPTION OF THE DRAWINGS

FIG. 12 is a flowchart view further detailing an embodiment of a computer-implemented method for estimating a battery discharge remaining useful life (Capacity RUL) of an observed or in-service battery asset.

DETAILED DESCRIPTION OF THE INVENTION

Figure 1:
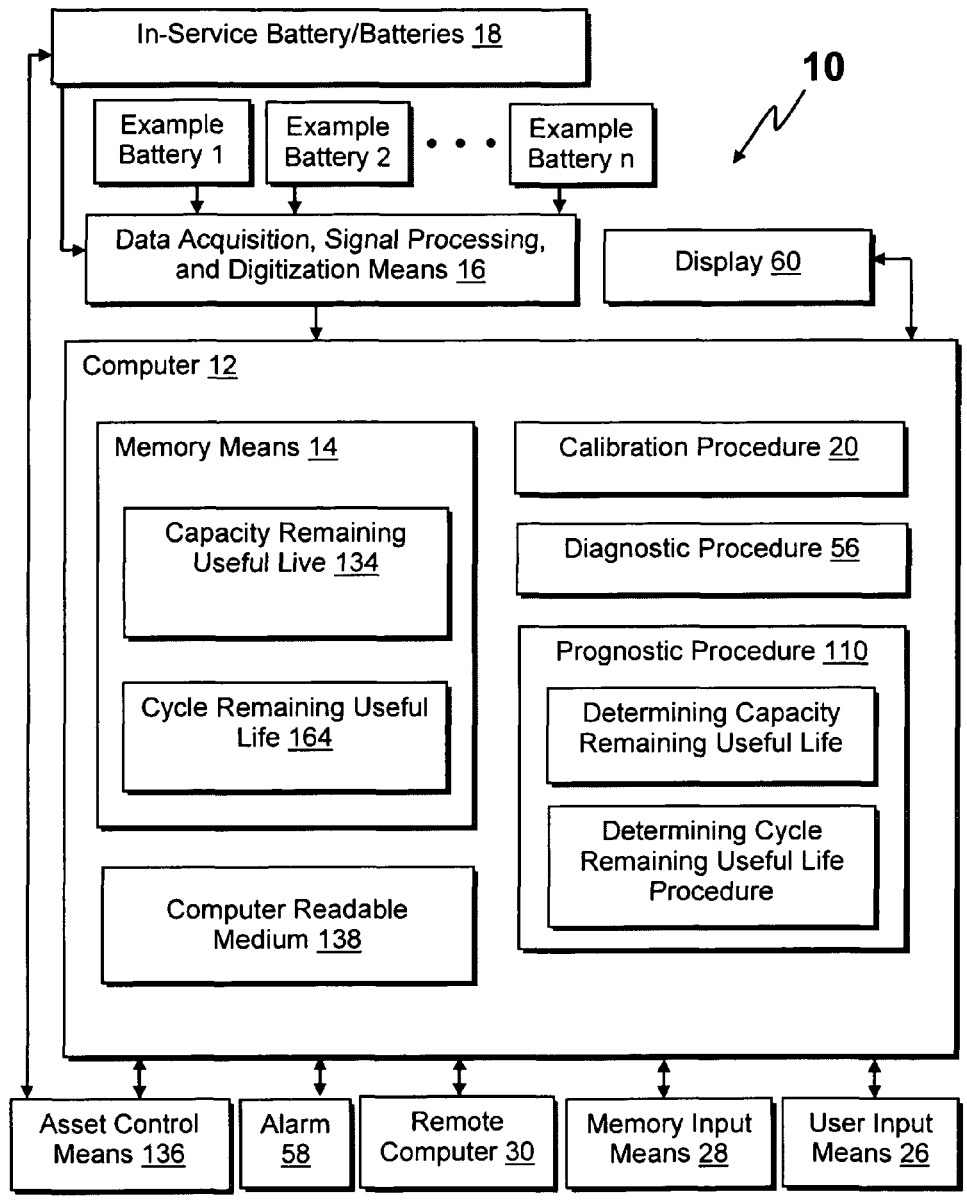
FIG. 1 is a general functional block diagram of an embodiment of a path classification and estimation (PACE) system and method for prognosticating a capacity remaining useful life (Capacity RUL) and a cycle remaining useful life (Cycle RUL) of a battery asset.

Considering the drawings, wherein like reference numerals denote like parts throughout the various drawing figures, reference numeral 10 is directed to a path classification and estimation (PACE) system and method for prognosticating a capacity remaining useful life (Capacity RUL) and a cycle remaining useful life (Cycle RUL) of a battery asset.

Referring to FIG. 1, and in one embodiment, the system and method 10 is comprised of a calibration procedure 20, a diagnostic procedure 56, and a prognostic procedure 110 which are, in one embodiment, implemented with software running on a computer 12 having an associated memory means 14 for prognosticating a time for which a battery can be used for a present or observed charge, a capacity remaining useful life 134, and/or for prognosticating a number of charge/discharge cycles for which a battery can be used before being replaced, a cycle remaining useful life 164.

Calibration Procedure 20

Figure 2:
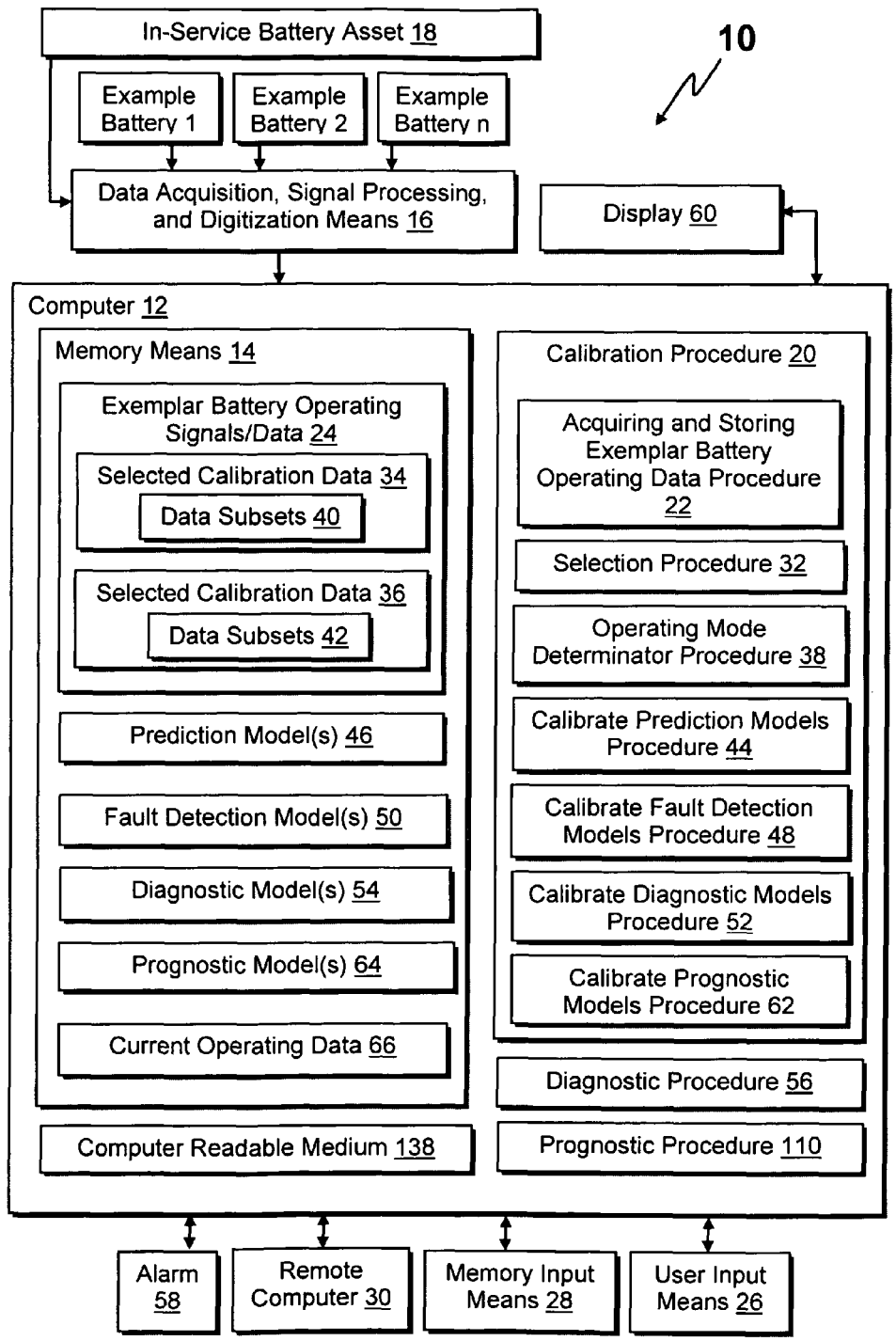
FIG. 2 is a functional block diagram detailing an embodiment of a calibration procedure of the path classification and estimation (PACE) system and method.

Referring to FIG. 2, and in one embodiment, the calibration procedure or method 20 is used in combination with the computer 12 and the memory means 14 for running a procedure 22 for acquiring exemplar battery operating signals or data 24 such as voltage and/or current signals or data from at least one exemplar battery asset exemplified by example battery asset number 1 to example battery asset number N and storing the exemplar battery operating data 24 in memory means 14.

The acquisition of the exemplar battery operating data 24 from at least one exemplar battery asset can be provided by a data acquisition, signal processing, and digitization means 16 electrically coupled between the computer 12 and at least one exemplar battery asset. The exemplar battery operating data 24 can also be acquired by memory means 14 of the computer 12 via, for example, user input means 26, memory input means 28, and/or remote computer means 30.

The calibration procedure or method 20 further comprises a selection procedure 32 for selecting calibration data from the acquired exemplar battery operating data 24 that identifies periods of battery operation that are correlative to expected battery operation thereby defining selected calibration data 34 and that identifies periods of battery operation that are correlative to degrading or failing battery operation for defining selected calibration data 36.

In one embodiment, the calibration procedure or method 20 may further comprise an operating mode determinator procedure 38 for partitioning the selected calibration data 34 into data subsets 40 that identify periods of battery operation or operating modes that are correlative to expected battery operation and for partitioning the selected calibration data 36 into data subsets 42 that identify periods of battery operation or operating modes that are correlative to degrading or failing battery operation. This procedure thereafter may be comprised of a calibration loop wherein each of the calibration data subsets 40 representative of a single operating mode may be utilized as necessary with a calibrate prediction models procedure 44 for calibrating one or more estimation or prediction models 46 and with a calibrate fault detection models procedure 48 for calibrating one or more fault detection models 50 as will be further delineated below. Similarly, This procedure may be comprised of a calibration loop wherein each of the calibration data subsets 42 representative of a single operating mode may be utilized as necessary with a calibrate diagnostic models procedure 52 for calibrating one or more diagnostic models 54 and with a calibrate prognostic models procedure 110 for calibrating one or more prognostic models 64 as will be further delineated below.

Methods suitable for operating mode determinator procedure 38 include, but are not limited to, mathematical or logic sequence techniques, expert system techniques, a plurality of fuzzy logic techniques, determined similarity techniques, clustering techniques, and neural network techniques.

Calibrate Prediction Models Procedure 44

More specifically, and referring to FIG. 2, the calibration procedure or method 20 performs the calibrate prediction models procedure 44 for calibrating or training one or more estimation or prediction models 46 by utilizing the selected calibration data 34 that identifies periods of battery operation that are correlative to expected battery operation. The calibration procedure 20 further stores the one or more prediction models 46 obtained from the calibrate prediction models procedure 44 in the memory means 14 for establishing one or more prediction models 46 for predicting expected values or a state for normal or acceptable conditions of at least one exemplar battery asset.

The calibrate prediction models procedure 44 may be, in general, performed using any prediction or estimation method suitable for defining one or more prediction models 46 useful for predicting or estimating expected values of battery data corresponding to acquired present battery data. Methods suitable for the calibrate prediction models procedure 44 include, but are not limited to, kernel regression techniques, multivariate state estimation techniques, neural network techniques, mathematical model techniques, autoregressive moving average techniques, and Kalman filter techniques. Each prediction model 46 may be created to implement any one of a plurality of prediction or estimation techniques. Further, a prediction or estimation technique implemented for an individual prediction model 46 is not constrained to be the same as the prediction or estimation technique implemented for any other prediction model 46.

In one embodiment, one or more prediction models 46 are in the form of one or more Kernel regression prediction models that are utilized for providing highly effective example-based learning of non-linear battery operating states directly from exemplar battery operating data. Once learned, these prediction models provide a high fidelity auto associative prediction of the expected value of each input variable given a present observation of the measured input variable values. In systems of correlated variables, this technique provides a fast and effective way to develop real-time capable stored models of normal battery asset operating characteristics.

In one embodiment, the calibration procedure or method 20 may employ the operating mode determinator procedure 38 for performing the calibration loop wherein each of the calibration data subsets 40 representative of a single operating mode may be utilized as necessary with the calibrate prediction models procedure 44 for calibrating one or more estimation or prediction models 46. Thus, an embodiment of the invention creates and uses, for the purpose of battery asset surveillance, a coordinated collection of prediction models 46 wherein each of the prediction models 46 in the coordinated collection is optimized for a single operating mode of one or more observed or in-service battery assets 18.

Calibrate Fault Detection Models Procedure 48

Referring to FIG. 2, and in one embodiment, the calibration procedure or method 20 also performs a calibrate fault detection models procedure or method 48 for calibrating one or more fault detection models 50 utilizing the selected calibration data 34 that identifies periods of battery operation that are correlative to expected battery operation.

One method suitable for the calibrate fault detection models procedure 48 includes, but is not limited to, an adaptive sequential probability (ASP) fault detector method which is described in U.S. Pat. No. 7,158,917; U.S. Pat. No. 7,082,379; and U.S. Pat. No. 6,892,163 and which are all incorporated herein by reference in their entireties as though fully set forth herein and wherein each has a common inventor with the present application. An extension of this method includes, but is not limited to, a self-calibrating adaptive sequential probability (ASP) fault detector method as disclosed in co-pending U.S. patent application Ser. No. 12/315,118, entitled "Asset Surveillance System and Method Comprising Self-Calibrating Fault Detection," filed Nov. 28, 2008 and which also has a common inventor with the present application.

Further methods suitable for the calibrate fault detection models procedure 48 include, but are not limited to, sequential probability ratio test methods, hypothesis test methods, neural network methods, mathematical model methods, comparison threshold methods, limit comparison methods, similarity methods, and trend analysis methods.

Each fault detection model 50 may be created to implement any of a plurality of fault detection methods. Further, the fault detection methods implemented for an individual fault detection model 50 is not constrained to be the same as the fault detection methods implemented for any other model contained in the fault detection models 50 for detecting fault indications on the basis of one or more observed or present data values from one or more observed or in-service battery assets 18.

In one embodiment, the calibration procedure or method 20 may employ the operating mode determinator procedure 38 for performing the calibration loop wherein each of the calibration data subsets 40 representative of a single operating mode may be utilized as necessary with the calibrate fault detection models procedure 48 for calibrating one or more fault detection models 50. Thus, an embodiment of the invention creates and uses, for the purpose of battery asset surveillance, a coordinated collection of fault detection models 50 wherein each of the fault detection models 50 in the coordinated collection is optimized for a single operating mode of one or more observed or in-service battery assets 18.

Calibrate Diagnostic Models Procedure 52

Referring to FIG. 2, and in one embodiment, the calibration procedure or method 20 also performs the calibrate diagnostic models procedure or method 52 for calibrating one or more diagnostic models 54 utilizing the selected calibration data 36 that identifies periods of battery operation that are correlative to degrading or failing battery operation. The calibration procedure or method 20 further comprises the step of storing one or more diagnostic models 54 in the memory means 14 for use in diagnosing a presence and type of battery degradation or fault that is occurring and that might lead to eventual failure of the battery to meet its service life requirements.

Additionally, the diagnosis of one or more diagnostic models 54 can be utilized in determining which prognostic model 58 is utilized for prognosticating the capacity remaining useful life 134 and/or for prognosticating the cycle remaining useful life 164.

In one embodiment, the calibrate diagnostic models procedure 52 utilizes a Nonparametric Fuzzy Inference System (NFIS) prediction method and one or more Nonparametric Fuzzy Inference System (NFIS) prediction models as disclosed in, and which this application is a continuation-in-part of, co-pending U.S. application Ser. No. 12/315,137, entitled "Nonparametric fuzzy inference system and method," filed Nov. 28, 2008, and which claims priority to U.S. Provisional Patent Application No. 61/004,839, filed Nov. 30, 2007, wherein both are incorporated herein by reference in their entireties as though fully set forth herein and wherein both have a common inventor with the present application.

Additional methods suitable for the calibrate diagnostic models procedure 52 include, but are not limited to, Bayesian belief network techniques, neural network techniques, decision tree techniques, expert system techniques, rule-based techniques, determined similarity techniques, hypothesis test techniques, and procedural logic techniques.

Each diagnostic model 54 may be created to implement any of a plurality of fault diagnosis, cause, or classification techniques. Further, the diagnosis technique implemented for an individual model is not constrained to be the same as the diagnosis technique implemented for any other model contained in the diagnostic models 54.

In one embodiment, the calibration procedure or method 20 may employ the operating mode determinator procedure 38 for performing the calibration loop wherein each of the calibration data subsets 42 representative of a single operating mode may be utilized as necessary with the calibrate diagnostic models procedure 52 for calibrating one or more diagnostic models 54. Thus, an embodiment of the invention creates and uses, for the purpose of battery asset surveillance, a coordinated collection of diagnostic models 54 wherein each of the diagnostic models 54 in the coordinated collection is optimized for a single operating mode of one or more observed or in-service battery assets 18.

At this point, the system and method 10 includes one or more estimation or prediction models 46, one or more fault detection models 50, and one or more diagnostic models 54 for utilization for performing surveillance of one or more in-service battery assets 18. Additionally, and in one embodiment, the system and method 10 can include one or more estimation or prediction models 46, one or more fault detection models 50, and one or more diagnostic models 54 that are each defined for a specific operating mode for utilization for performing surveillance of one or more in-service battery assets 18.

Diagnostic Procedure

Figure 3:
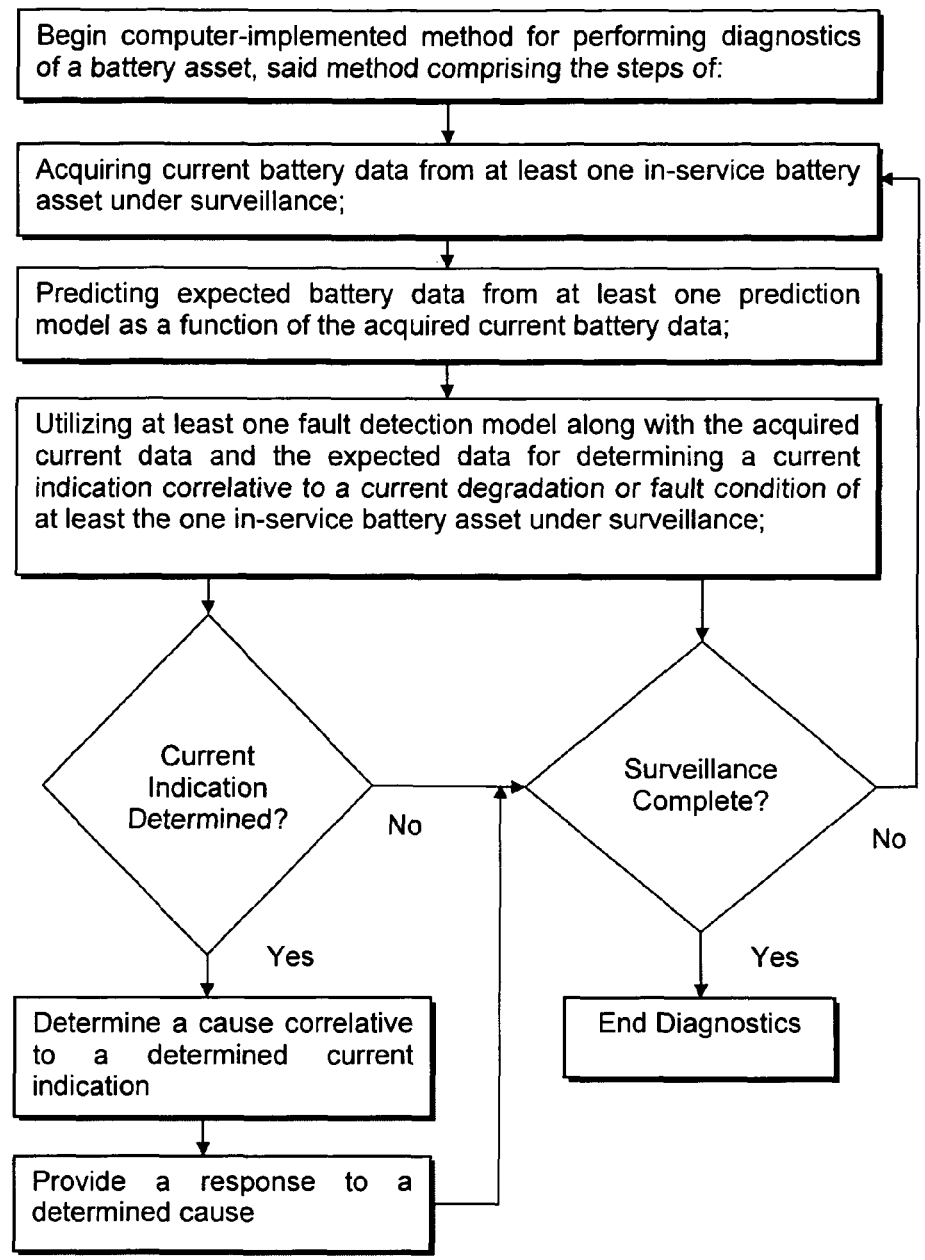
FIG. 3 is a functional flow diagram detailing an embodiment of a diagnostics procedure of the path classification and estimation (PACE) system and method.

Referring now to FIGS. 2 and 3, and as noted above, the system and method 10 is further comprised of the diagnostic procedure 56. In one embodiment, the diagnostic procedure 56 includes the steps of acquiring observed or present battery data 66 from at least one observed or in-service battery asset 18 under surveillance, predicting expected data or values from one or more of the prediction models 46 as a function of the acquired observed or present battery data 124, utilizing one or more of the fault detection models 50 along with the acquired observed or present data and the expected data for determining a present indication correlative to a present degradation or fault condition of at least the one observed or in-service battery asset 18 under surveillance, determining a present diagnosis from one or more of the diagnostic models 54 as a function of each determined present fault indications; and providing a response to each determined cause. When a present fault indication is determined, a warning or alarm can be provided via alarm 58 or displayed via computer display 60.

The acquisition of the observed or present battery data 66 from at least one observed or in-service battery asset 18 can be provided by the data acquisition, signal processing, and digitization means 16, electrically coupled between the computer 12 and at least the one observed or in-service battery asset 18. The observed or present battery data 66 can also be acquired by memory means 14 of the computer 12 via, for example, user input means 26, memory input means 28, and/or remote computer means 30.

Calibrate Prognostic Models Procedure 62

In general, and referring to FIG. 2, the calibration procedure or method 20 also performs a calibrate prognostic models procedure or method 62 for calibrating one or more prognostic models 64 utilizing the exemplar battery operating signals or data 24. The calibration procedure or method 20 further comprises the step of storing one or more calibrated prognostic models 64 in the memory means 14.

Figure 4:
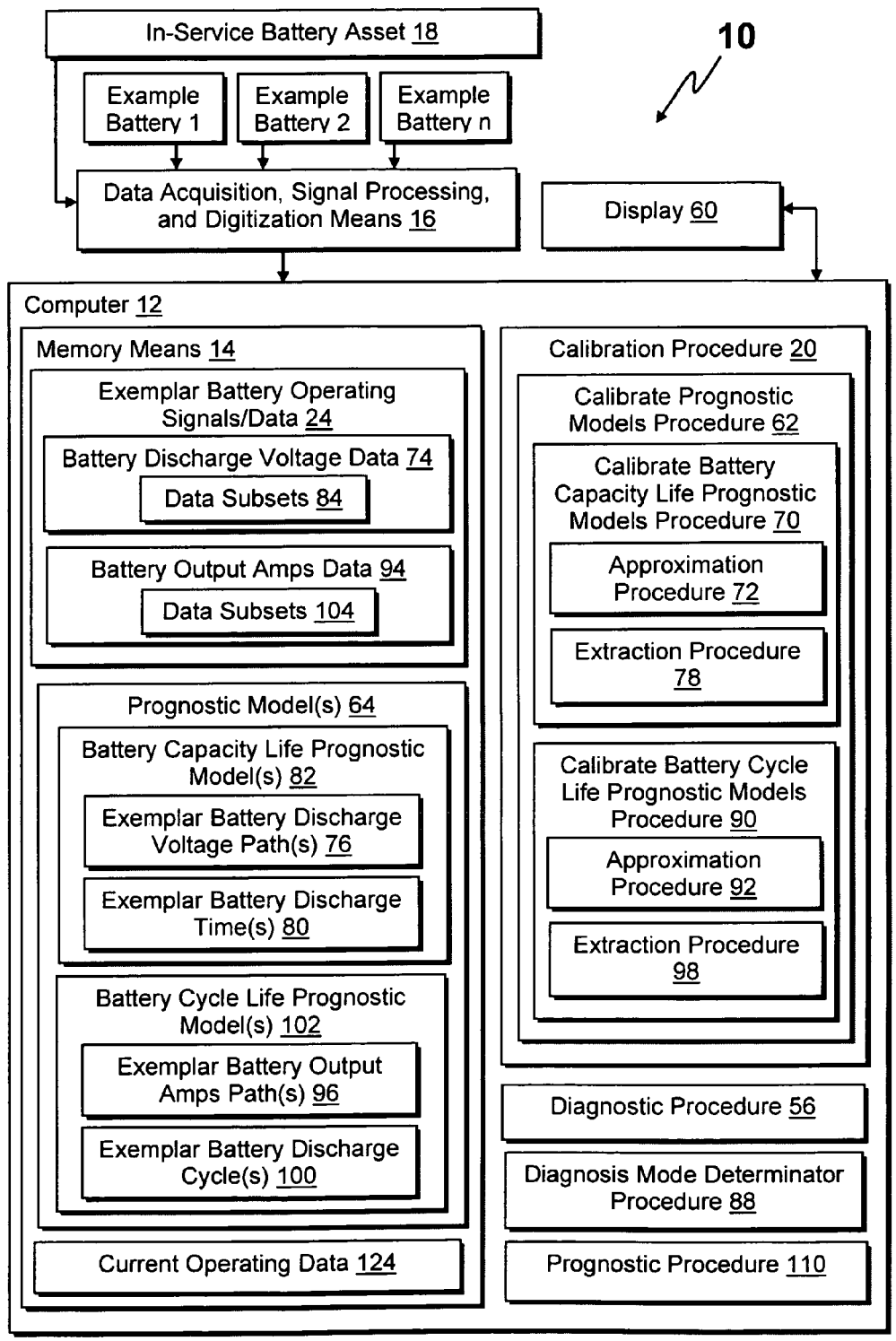
FIG. 4 is a functional block diagram further detailing the embodiment of the training or calibration procedure of the path classification and estimation (PACE) system and method.

Referring now to FIG. 4, the calibrate prognostic models procedure 62 is comprised of a calibrate battery capacity life prognostic models procedure or method 70 and a calibrate battery cycle life prognostic models procedure or method 90.

Calibrate Battery Capacity Life Prognostic Models Procedure 70

Figure 5:
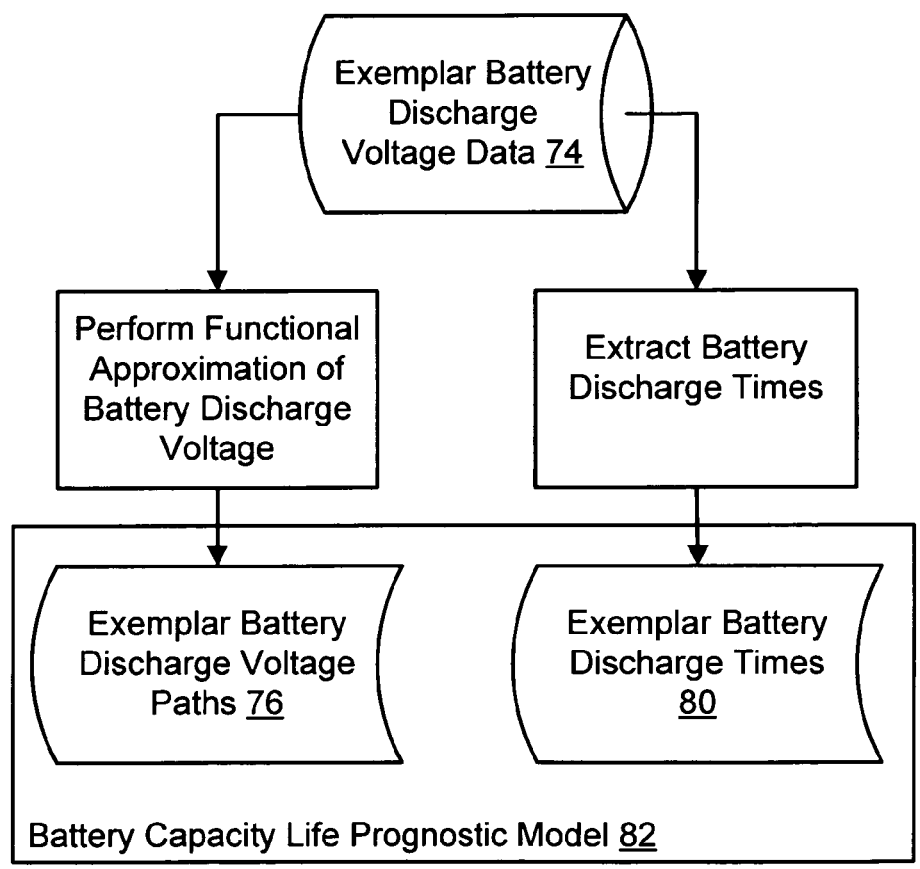
FIG. 5 is a functional flow diagram detailing an embodiment of a calibrate battery capacity life prognostic models procedure of the path classification and estimation (PACE) system and method.

Referring to FIGS. 4 and 5, the calibrate battery capacity life prognostic models procedure 70 performs an approximation procedure 72 for performing functional approximation (polynomial, neural network, et cetera) of the exemplar battery operating signals or data 24 in the form of, for example, exemplar battery discharge voltage data 74 for defining exemplar battery discharge voltage paths 76 and storing the exemplar battery discharge voltage paths 76 in memory means 14.

Additionally, the calibrate battery capacity life prognostic models procedure 70 performs an extraction procedure 78 for extracting battery discharge times from the exemplar battery discharge voltage data 74 for defining exemplar battery discharge times 80 and for storing the exemplar battery discharge times 80 in memory means 14. Accordingly, the exemplar battery discharge voltage paths 76 and the exemplar battery discharge times 80 defines at least one battery capacity life prognostic model 82.

In one embodiment, the operating mode determinator procedure 38 (FIG. 2) partitions the exemplar battery discharge voltage data 74 into data subsets 84 that identify periods of battery operation or operating modes of at least the one exemplar battery asset. Then, the calibrate battery capacity life prognostic models procedure 70 may employ the operating mode determinator procedure 38 for performing a calibration loop wherein each of the data subsets 84 representative of a single operating mode may be utilized as necessary with the calibrate battery capacity life prognostic models procedure 70 for calibrating one or more battery capacity life prognostic model 82. Thus, an embodiment of the invention creates and uses, for the purpose of battery asset surveillance, a coordinated collection of battery capacity life prognostic models 82 wherein each of the battery capacity life prognostic models 82 in the coordinated collection is optimized for a single operating mode of one or more observed or in-service battery assets 18.

Additionally, and in one embodiment, the system and method 10 is further comprised of the diagnosis mode determinator procedure 88 that can partition the exemplar battery discharge voltage data 74 into data subsets 84 as a function of different diagnosis for obtaining a collection of battery capacity life prognostic models 82 that are individually optimized for a single diagnosis of a fault indication of one or more observed or in-service battery assets 18.

Calibrate Battery Cycle Life Prognostic Models Procedure 90

Figure 6:
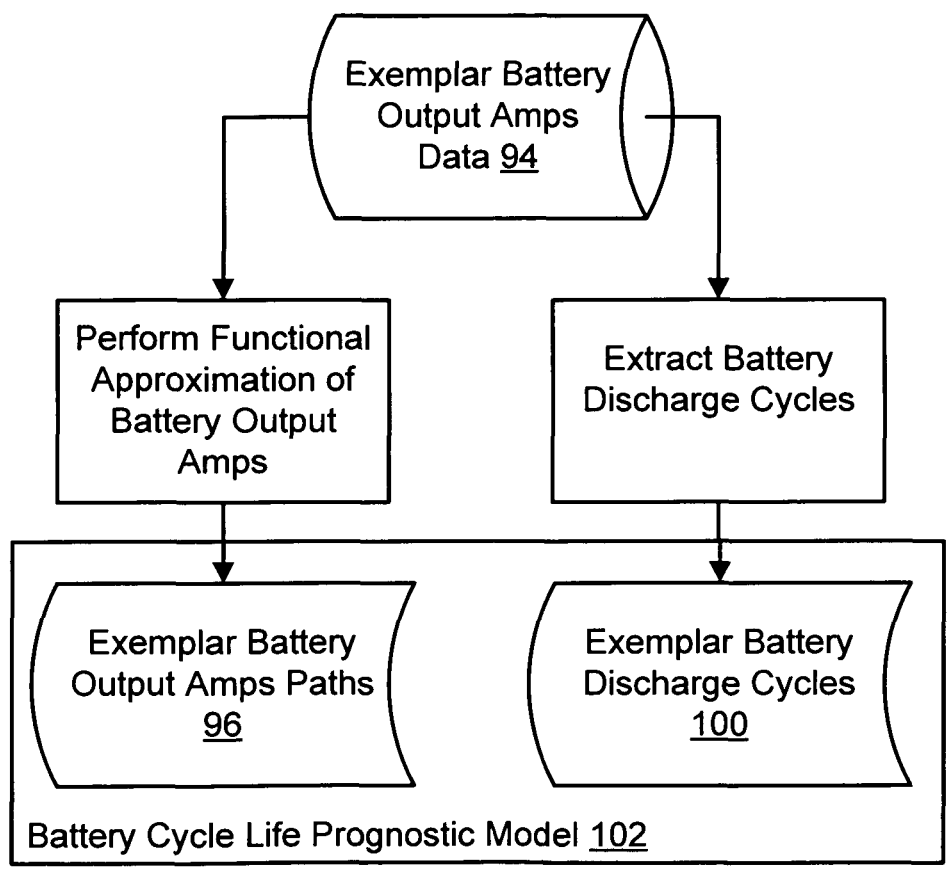
FIG. 6 is a functional flow diagram detailing an embodiment of a calibrate battery cycle life prognostic models procedure of the path classification and estimation (PACE) system and method.

Referring to FIGS. 4 and 6, the calibrate battery cycle life prognostic models procedure 90 performs an approximation procedure 92 for performing functional approximation (polynomial, neural network, et cetera) of the exemplar battery operating signals or data 24 in the form of, for example, exemplar battery output amps data 94 for defining exemplar battery output amps paths 96 and storing the exemplar battery output amps paths 96 in memory means 14.

Additionally, the calibrate battery cycle life prognostic models procedure 90 performs an extraction procedure 98 for extracting battery discharge cycles from the exemplar battery output amps data 94 for defining exemplar battery discharge cycles 100 representative of an accumulated number of charge/discharge cycles for which the exemplar battery asset has been used before reaching the end of its useful service life and for storing the exemplar battery discharge cycles 100 in memory means 14. Accordingly, the exemplar battery output amps paths 96 and the exemplar battery discharge cycles 100 defines at least one battery cycle life prognostic model 102.

In one embodiment, the operating mode determinator procedure 38 (FIG. 2) partitions the exemplar battery output amps data 94 into data subsets 104 that identify periods of battery operation or operating modes of at least the one exemplar battery asset. Then, the calibrate battery cycle life prognostic models procedure 90 can employ the operating mode determinator procedure 38 for performing a calibration loop wherein each of the data subsets 104 representative of a single operating mode may be utilized as necessary with the calibrate battery cycle life prognostic models procedure 90 for calibrating one or more battery cycle life prognostic model 102. Thus, an embodiment of the invention creates and uses, for the purpose of battery asset surveillance, a coordinated collection of battery cycle life prognostic models 102 wherein each of the battery cycle life prognostic models 102 in the coordinated collection is optimized for a single operating mode of one or more observed or in-service battery asset 18.

Additionally, and in one embodiment, the system and method 10 is further comprised of the diagnosis mode determinator procedure 88 that can partition the exemplar battery output amps data 94 into data subsets 104 as a function of different diagnosis for obtaining a collection of battery cycle life prognostic models 102 that are individually optimized for a single diagnosis of a fault indication of one or more in-service battery assets 18.

General Prognostic Procedure

The system and method 10 further includes the prognostic procedure 110. In one embodiment, battery prognostics are comprised of two kinds of remaining useful life (RUL) measures or determinations. One measure or determination of remaining useful life is a time for which an observed or in-service battery asset 18 can be used for a present or observed charge (Capacity RUL) and another measure or determination of remaining useful life is a number of charge/discharge cycles for which an observed or in-service battery asset 18 can be used before being replaced (Cycle RUL).

Figure 7:
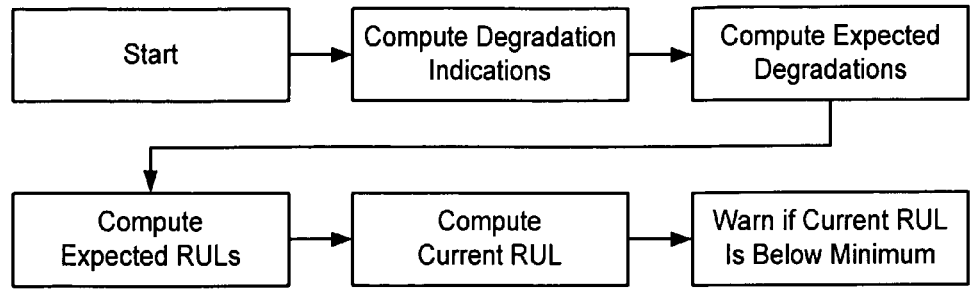
FIG. 7 is a general functional block diagram of a general prognostic procedure of the path classification and estimation (PACE) system and method.

Referring to FIG. 7, and in general, an embodiment of the prognostic procedure 110 is utilized to determine present degradation indications, determine expected degradations, determine expected remaining useful lives (RUL) for the expected degradations, and determine the present remaining useful life of the battery under surveillance. Degradation indications might be computed from one or more of observed values, predicted values, residual values or fault indications, or from combinations or transformations thereof. When the present RUL falls below an acceptable value, a warning or alarm is provided.

Figure 8:
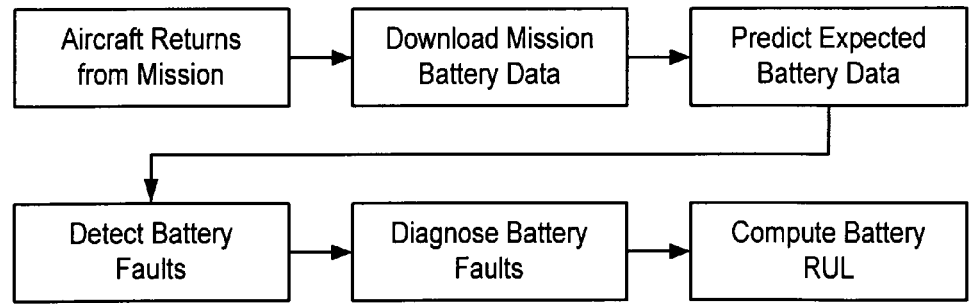
FIG. 8 is a general functional block diagram of a military aircraft application procedure of the path classification and estimation (PACE) system and method.

Referring to FIG. 8, and in general, an embodiment the system and method 10 provides battery prognostics for military aircraft batteries by downloading mission battery data after an aircraft mission is completed and then implementing the diagnostic and prognostic procedures 56, 110 for processing sequential observations of battery parameters contained within the downloaded data.

The system and method 10 repeats the diagnostic procedure 56 and the prognostic procedure 110 with each new acquisition of present data from the battery asset under surveillance thus providing an on-going surveillance for prognostics of battery assets. The initial calibration procedure 20 is nominally performed once or might be performed periodically as additional example battery data becomes available.

Prognostic Procedure 110: Capacity Life Prognostics

Figure 9:
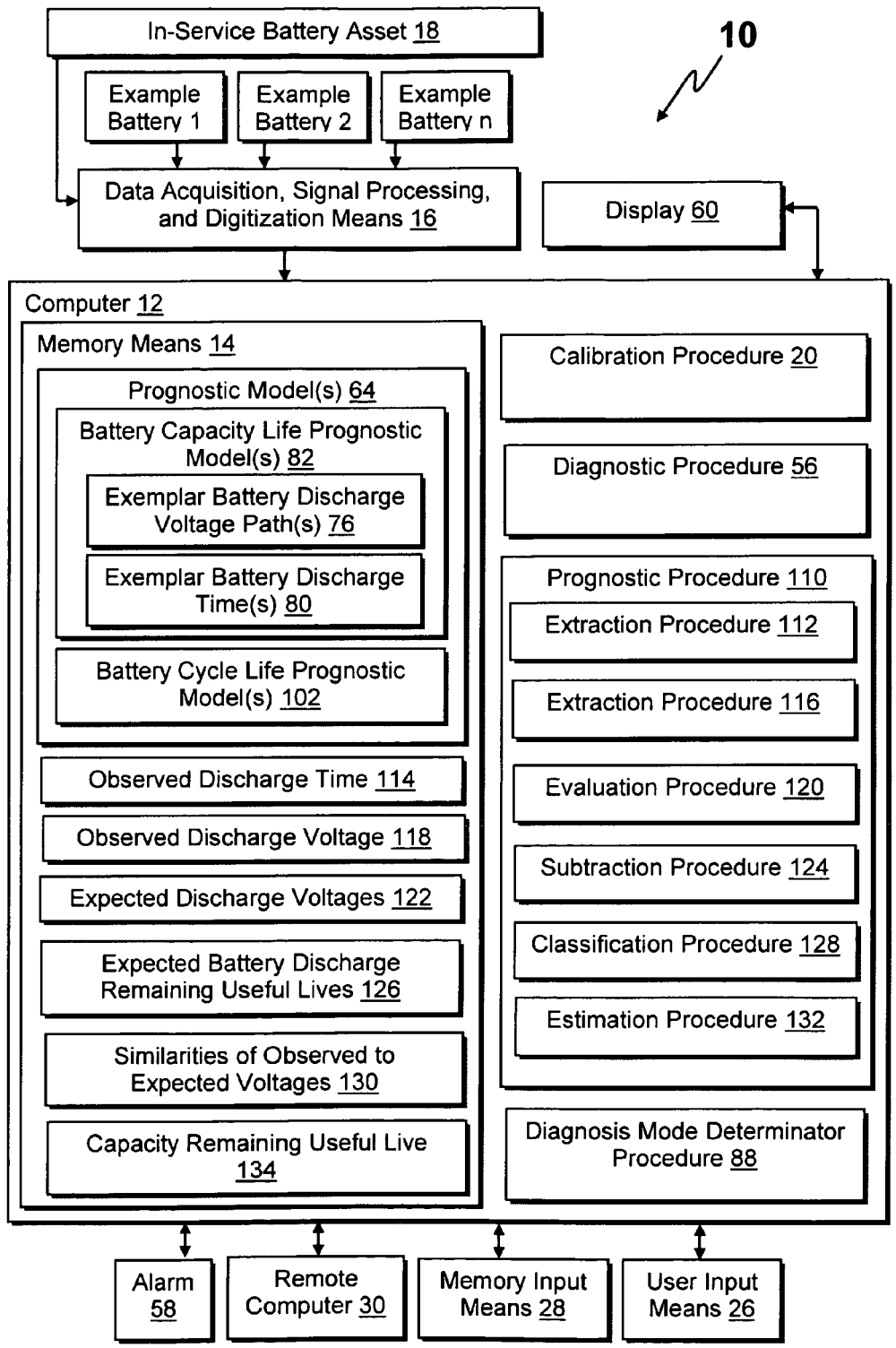
FIG. 9 is a functional block diagram detailing an embodiment of a detailed prognostic procedure of the path classification and estimation (PACE) system and method.
Figure 10:
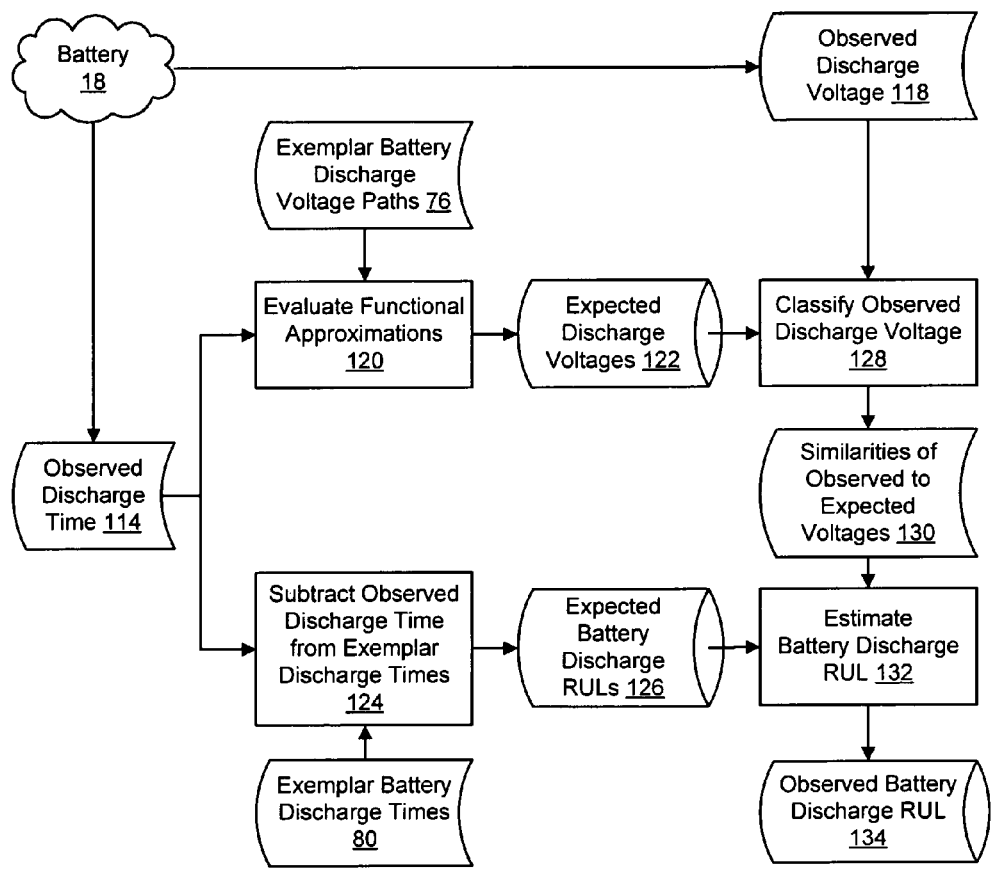
FIG. 10 is a functional flow diagram detailing an embodiment of the detailed prognostic procedure of the path classification and estimation (PACE) system and method.

Referring now to FIGS. 9 and 10, and in one embodiment, the prognostic procedure 110 employs the stored functions that represent the exemplar battery asset discharge voltage paths 76 and the associated exemplar battery asset discharge times 80 for prognosticating the capacity remaining useful life (Capacity RUL) of another battery asset such as at least one observed or in-service battery asset 18.

In one embodiment, the prognostic procedure 110 starts with an extraction procedure 112 for extracting an observed discharge time 114 from at least one observed or in-service battery asset 18 and an extraction procedure 116 for extracting observed discharge voltage 118 from at least the one in-service battery asset 18.

The observed discharge time 114 and the observed discharge voltage 118 can be acquired by the computer 12 and thus, by memory means 14 via, for example, the data acquisition, signal processing, and digitization means 16 electrically coupled between the computer 12 and at least the one in-service battery asset 18, user input means 26 electrically coupled to the computer 12, memory input means 28 electrically coupled to the computer 12, and/or remote computer means 30 electrically coupled to the computer 12.

Next, the prognostic procedure 110 performs an evaluation procedure 120 comprised of evaluating functional approximations of the exemplar battery asset discharge voltage paths 76 at the observed discharge time 114 to obtain expected discharge voltages 122.

The prognostic procedure 110 also performs a subtraction procedure 124 comprised of subtracting observed discharge time 114 from the exemplar battery asset discharge times 80 to obtain expected battery discharge remaining useful lives (RULs) 126.

At this point, the prognostic procedure 110 performs a classification procedure 128 comprised of classifying the observed discharge voltage 118 according to the expected discharge voltages 122. In particular, and in one embodiment, the prognostic process 110 performs the classification procedure 128 comprised of classifying the observed discharge voltage 118 of at least the one battery asset 18 by determining a plurality of similarities that each quantify how similar the observed discharge voltage 118 is to each of the previously collected examples or functions that represent the exemplar battery asset discharge voltage paths 76 for obtaining similarities of observed to expected voltages 130.

Finally, the prognostic procedure 110 performs an estimate battery discharge remaining useful life procedure or estimation procedure 132 comprised of combining the plurality of similarities of observed to expected voltages 130 with the expected battery discharge remaining useful lives (RULs) 126 for obtaining an estimation or prognostication of the observed or in-service battery discharge remaining useful live (RUL) or the remaining capacity Life (Capacity RUL) 134 of the at least one observed or in-service battery asset 18.

Figure 11:
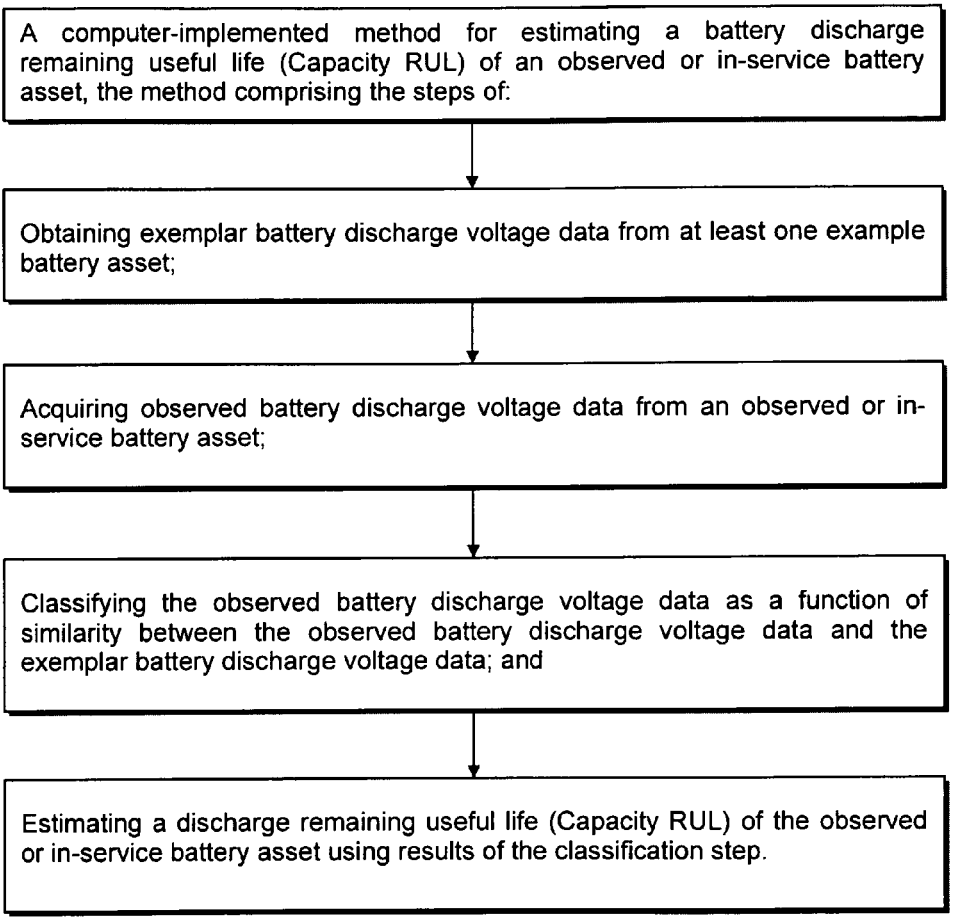
FIG. 11 is a general flowchart view of an embodiment of a computer-implemented method for estimating a battery discharge remaining useful life (Capacity RUL) of an observed or in-service battery asset.

Accordingly, and in one aspect, FIG. 11 illustrates a general flowchart view of an embodiment of a computer-implemented method for estimating a battery discharge remaining useful life or a battery capacity remaining useful life (Capacity RUL) of at least one observed or in-service battery asset 18.

Additionally, an embodiment of the invention provides a computer-readable medium 138 (FIG. 1) having computer executable instructions recorded thereon which causes, in use, the computer 12 running the instructions to generally execute a procedure according to the computer-implemented method illustrated in FIG. 11.

In another aspect, FIG. 12 illustrates a flowchart view further detailing an embodiment of a computer-implemented method for estimating or prognosticating a battery discharge remaining useful life (Capacity RUL) of at least one observed or in-service battery asset 18. Additionally, an embodiment of the invention provides the computer-readable medium 138 having computer executable instructions recorded thereon which causes, in use, the computer 12 running the instructions to generally execute a procedure according to the computer-implemented method illustrated in FIG. 12.

Generally, any type of computer readable medium 138 may be employed and examples include floppy disks, hard disks including rotating and solid state devices, CD-ROMS, Flash ROMS, nonvolatile ROM, and RAM. Additionally, the memory means 14 may be employed for the computer readable medium 138.

Furthermore, and in an embodiment of the invention, a computer-implemented method for estimating the remaining useful life of the observed or in-service battery asset 18 can further include one or more of the following steps: communicating the estimated remaining useful life of the present asset to a remote computer 30, sounding an alarm 58 when an alarm action is determined to be necessitated as a function of the remaining useful life of the observed or in-service battery asset 18; performing a control action, via asset control means 136 (FIG. 1), on the observed or in-service battery asset 18 when determined to be necessitated as a function of the capacity remaining useful life (Capacity RUL) of observed or in-service battery asset 18; and/or displaying the capacity remaining useful life (Capacity RUL) on a display 60.

Prognostic Procedure 110: Cycle Life Prognostics

Figure 13:
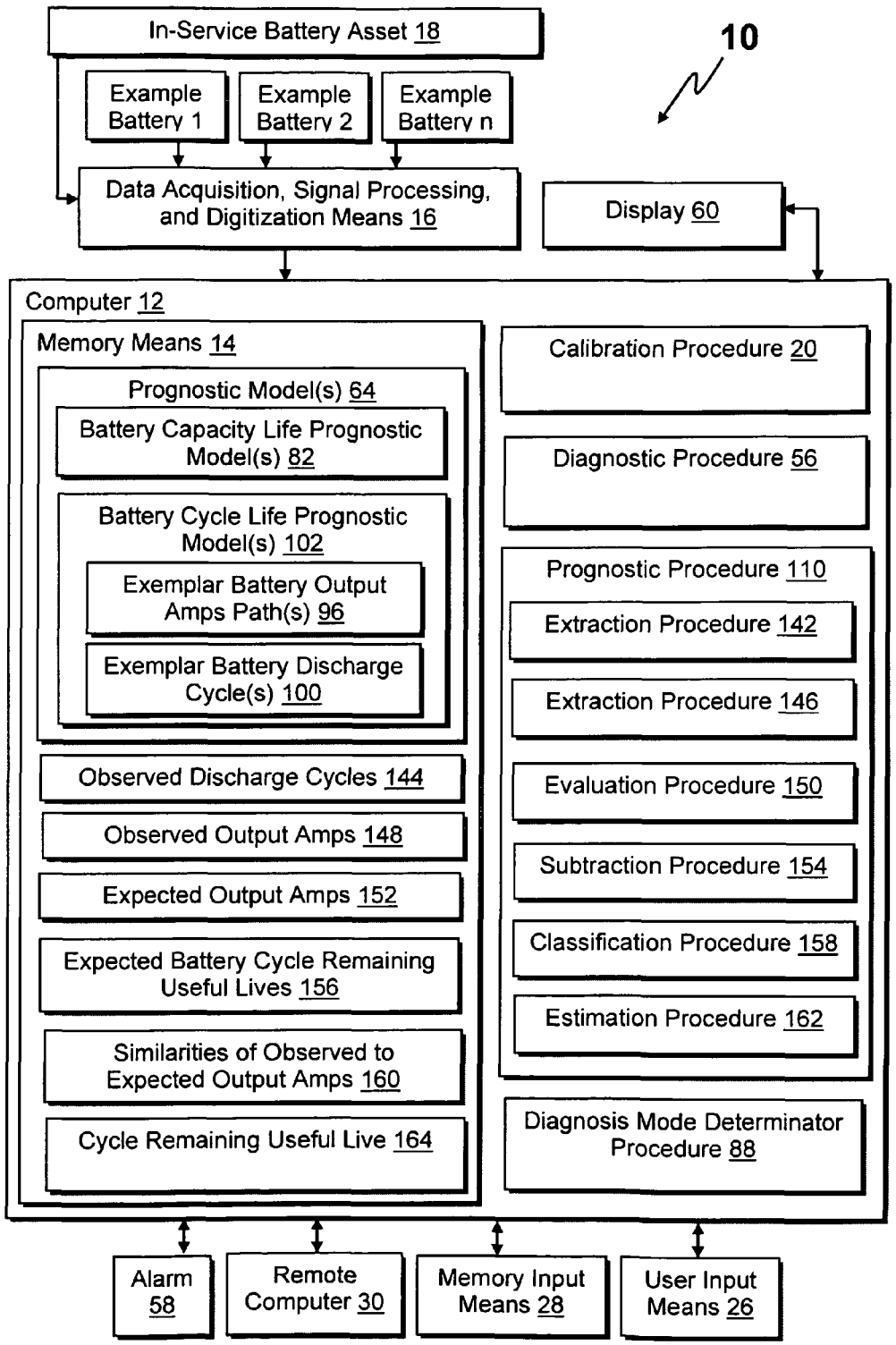
FIG. 13 is a functional block diagram further detailing the embodiment of the detailed prognostic procedure of the path classification and estimation (PACE) system and method.
Figure 14:
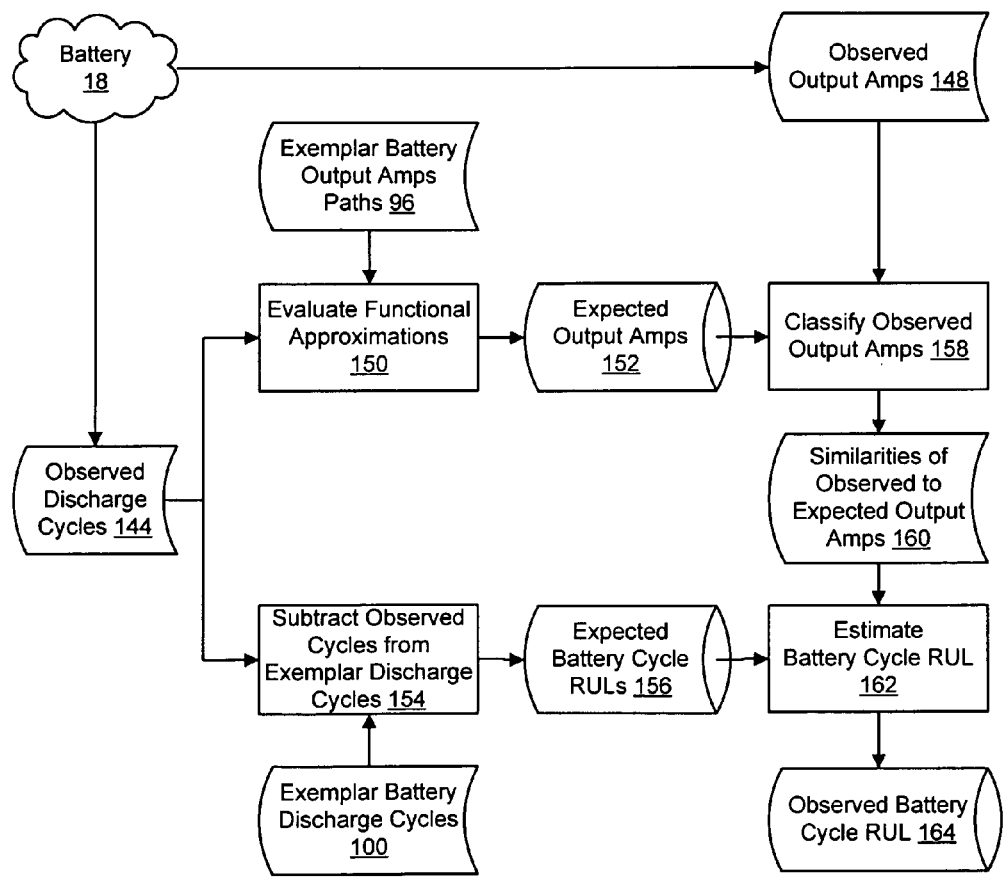
FIG. 14 is a functional flow diagram further detailing the embodiment of the detailed prognostic procedure of the path classification and estimation (PACE) system and method.

Referring now to FIGS. 13 and 14, and in one embodiment, the prognostic procedure 110 employs the stored functions that represent the exemplar battery asset output amps paths 96 and the associated exemplar battery asset discharge cycles 100 for prognosticating the cycle remaining useful life (cycle RUL) of another battery asset such as at least one observed or in-service battery asset 18.

In one embodiment, the prognostic procedure 110 starts with an extraction procedure 142 for extracting observed or present discharge cycles 144 from at least one observed or in-service battery asset 18 and an extraction procedure 146 for extracting observed or present output amps 148 from at least one observed or in-service battery asset 18.

The observed discharge cycles 144 and the observed output amps 148 can be acquired by the computer 12 and thus, by memory means 14 via, for example, the data acquisition, signal processing, and digitization means 16 electrically coupled between the computer 12 and at least the one in-service battery asset 18, user input means 26 electrically coupled to the computer 12, memory input means 28 electrically coupled to the computer 12, and/or remote computer means 30 electrically coupled to the computer 12.

Next, the prognostic procedure 110 performs an evaluation procedure 150 comprised of evaluating functional approximations of the exemplar battery asset output amps paths 96 at the observed discharge cycles 144 to obtain expected output amps 152.

The prognostic procedure 110 also performs a subtraction procedure 154 comprised of subtracting observed discharge cycles 144 from the exemplar battery asset discharge cycles 100 to obtain expected battery cycle remaining useful lives (RULs) 156.

At this point, the prognostic procedure 110 performs a classification procedure 158 comprised of classifying the observed or present output amps 148 according to the expected output amps 152. In particular, and in one embodiment, the prognostic process 110 performs the classification procedure 158 comprised of classifying the observed output amps 148 of at least one observed or in-service battery asset 18 by determining a plurality of similarities that each quantify how similar the observed output amps 148 are to each of the previously collected examples or functions that represent the exemplar battery asset output amps paths 96 for obtaining similarities of observed to expected output amps 160.

Finally, the prognostic procedure 110 performs an estimate battery cycle remaining useful life procedure or estimation procedure 162 comprised of combining the plurality of similarities of observed to expected output amps 160 with the expected battery cycle remaining useful lives (RULs) 156 for obtaining an estimation or prognostication of the cycle remaining useful life (Cycle RUL) 164 of at least one observed or in-service battery asset 18.

Figure 15:
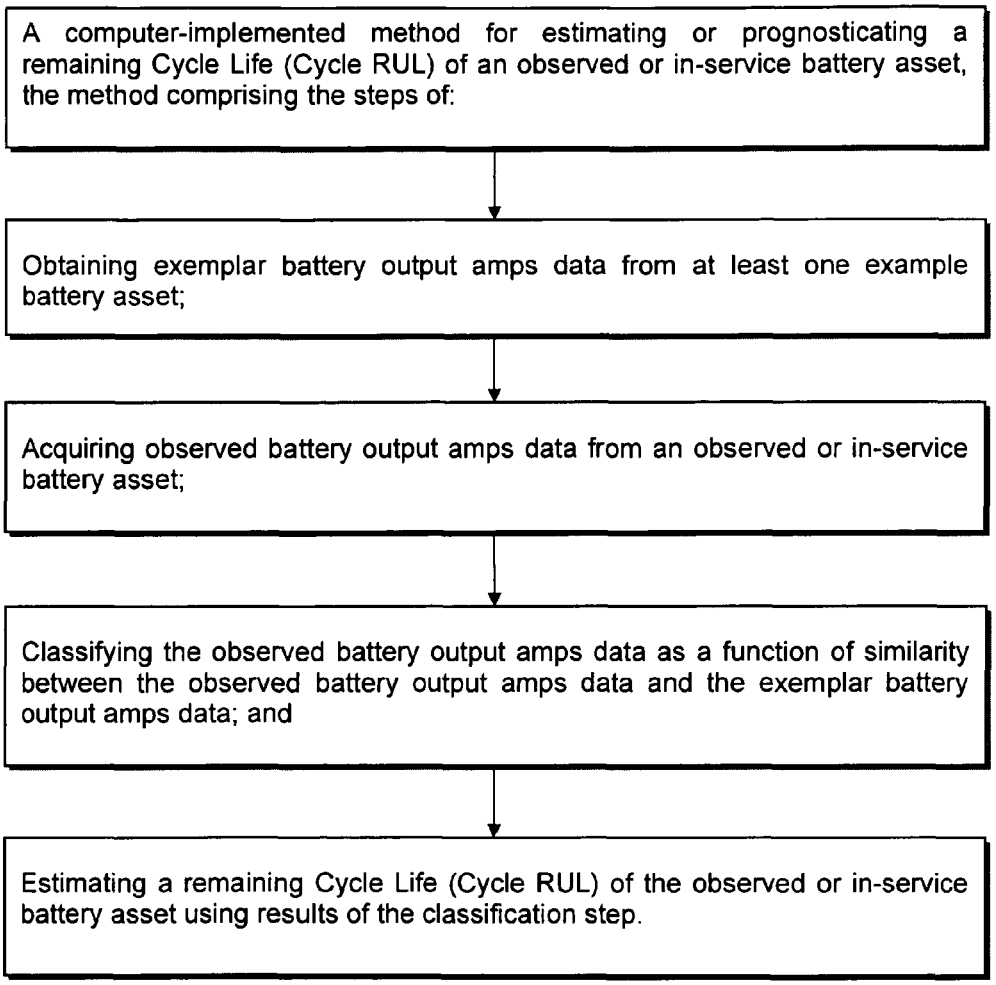
FIG. 15 is a general flowchart view of an embodiment of a computer-implemented method for estimating a estimating or prognosticating a remaining Cycle Life (Cycle RUL) of an observed or in-service battery asset.

Accordingly, and in one aspect, FIG. 15 illustrates a general flowchart view of an embodiment of a computer-implemented method for estimating or prognosticating a cycle remaining useful life (Cycle RUL) 164 of an observed or in-service battery asset 18. Additionally, an embodiment of the invention provides a computer-readable medium 138 (FIG. 1) having computer executable instructions recorded thereon which causes, in use, the computer 12 running the instructions to generally execute a procedure according to the computer-implemented method illustrated in FIG. 15.

Figure 16:
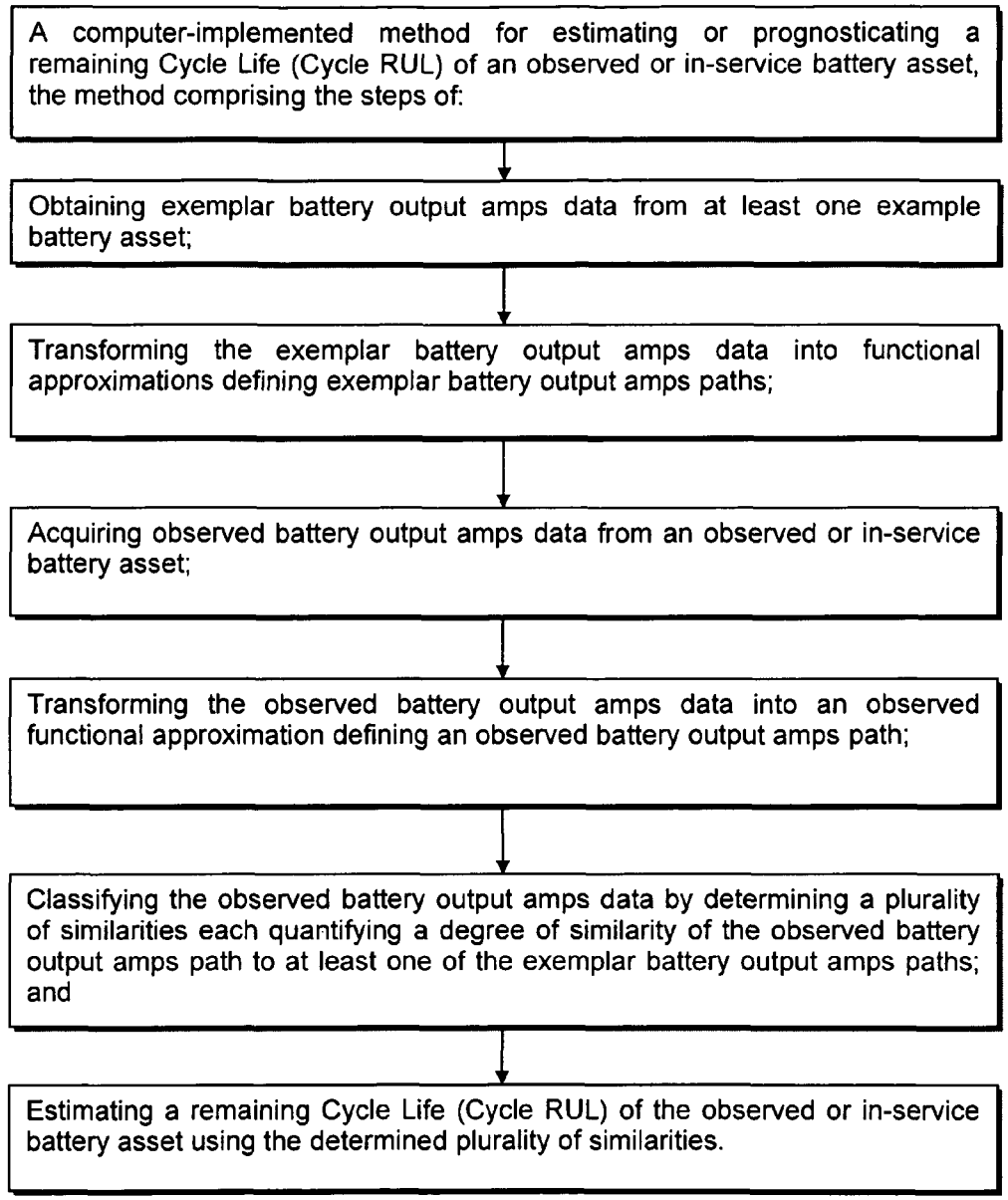
FIG. 16 is a flowchart view further detailing an embodiment of a computer-implemented method for estimating a estimating or prognosticating a remaining Cycle Life (Cycle RUL) of an observed or in-service battery asset.

In another aspect, FIG. 16 illustrates a flowchart view further detailing an embodiment of a computer-implemented method for estimating or prognosticating a remaining Cycle Life (Cycle RUL) of at least one observed or in-service battery asset 18.

Additionally, an embodiment of the invention provides the computer-readable medium 138 having computer executable instructions recorded thereon which causes, in use, the computer 12 running the instructions to generally execute a procedure according to the computer-implemented method illustrated in FIG. 16.

Generally, any type of computer readable medium 138 may be employed and examples include floppy disks, hard disks including rotating and solid state devices, CD-ROMS, Flash ROMS, nonvolatile ROM, and RAM. Additionally, the memory means 14 may be employed for the computer readable medium 138.

Furthermore, and in an embodiment of the invention, a computer-implemented method for estimating the remaining useful life of the observed or in-service battery asset 18 can further include one or more of the following steps: communicating the estimated remaining useful life of the observed or in-service battery asset to a remote computer 30, sounding an alarm 58 when an alarm action is determined to be necessitated as a function of the remaining useful life of the observed or in-service battery asset 18; performing a control action, via asset control means 136 (FIG. 1), on the observed or in-service battery asset 18 when determined to be necessitated as a function of the remaining cycle life (Cycle RUL) of the observed or in-service battery asset 18; and/or displaying the remaining cycle life (Cycle RUL) 164 on a display 60.

Mathematical Description of the PACE Method

In one embodiment, the path classification and estimation (PACE) system and method provides prognostics or estimations of the capacity remaining useful life (Capacity RUL) and the cycle remaining useful life (Cycle RUL) of at least one observed or in-service battery asset 18.

PACE is a dynamic prognostic procedure or method that can be incrementally calibrated to incorporate generalized (physical model, prior expert knowledge) and specific real world operating data or trends such as degradation trends.

PACE is fundamentally composed of two operations: First, classifying an observed or present path of a battery asset such as a degradation path as belonging to one or more of previously collected exemplar paths of at least one exemplar battery asset such as exemplar degradation paths; and Second, utilizing the memberships resulting from the classification to estimate the capacity and/or cycle RUL. Hence, the name path classification (classify path according to exemplar paths) and estimation (estimate the RUL from the results of the classification).

Figure 17:
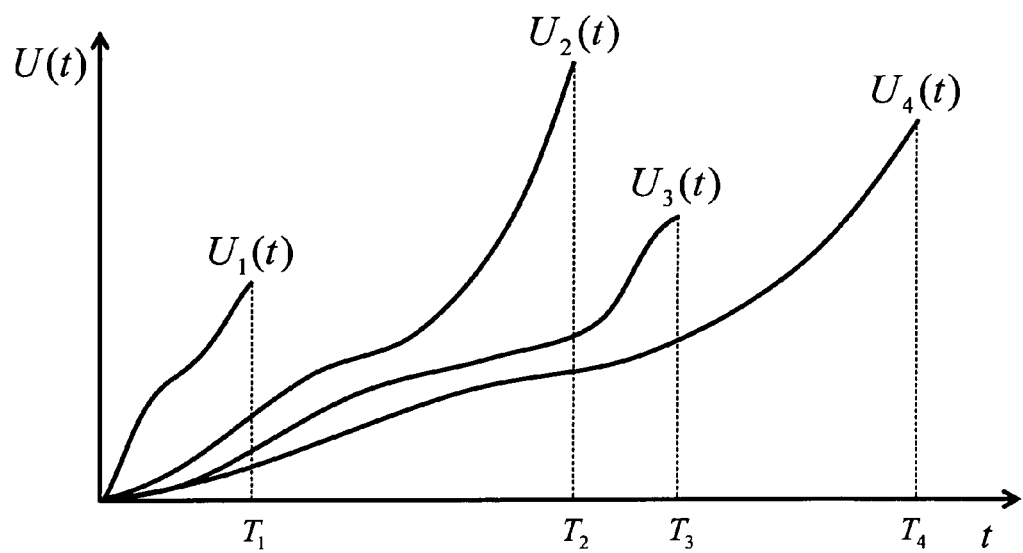
FIG. 17 illustrates a plot of example degradation signals of exemplar assets.

To illustrate, begin by considering the example degradation signals presented in FIG. 17. The degradation signals and their associated failure times are presented in the top plot. Here, the failure times can be set to be either the time that the device fails or the time at which an expert determines that the device performance has sufficiently degraded such that it has effectively failed. For this example, it can be seen that there is not a clear failure threshold for the degradation signal.

Figure 18:
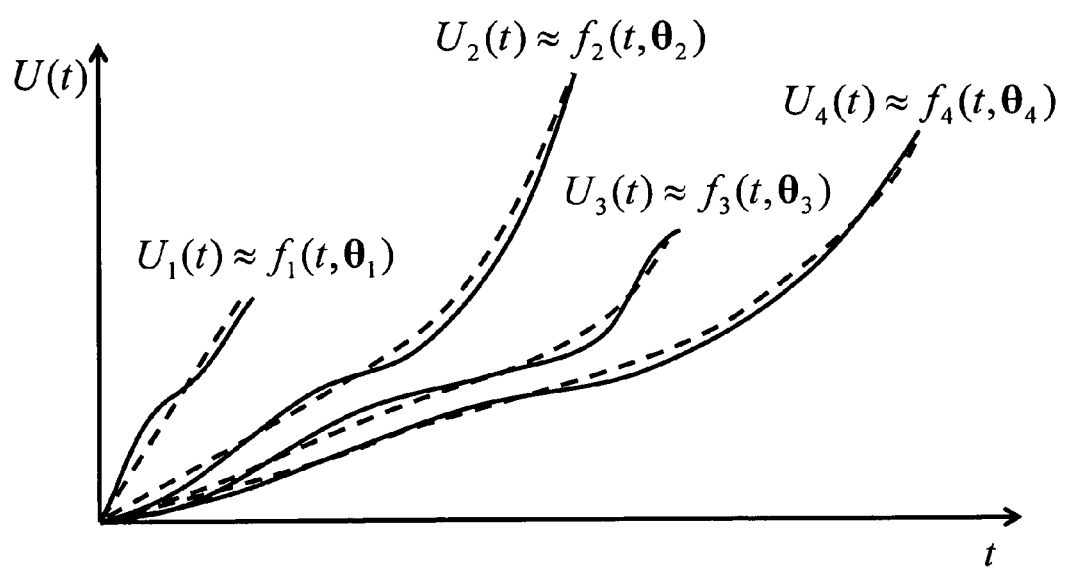
FIG. 18 illustrates a plot of the example degradation signals of exemplar assets illustrated in FIG. 17 and their associated functional approximations shown by dashed lines.

FIG. 18 illustrates that the paths are generalized by fitting an arbitrary function to the data via regression or other form of machine learning. There are two useful pieces of information that can be extracted from the degradation paths, specifically the failure times and the "shape" of the degradation that is described by the functional approximations. These pieces of information can be used to construct a vector of exemplar failure times and functional approximations, T and f(t, Θ). Here, $T_i$ and $f_i(t, \theta_i)$ are the failure times and functional approximation of the $i^{th}$ exemplar degradation signal path, $\theta_i$ are the parameters of the functional approximation of the $i^{th}$ exemplar degradation signal path, and Θ are all of the parameters of each functional approximation.

Figure 19:
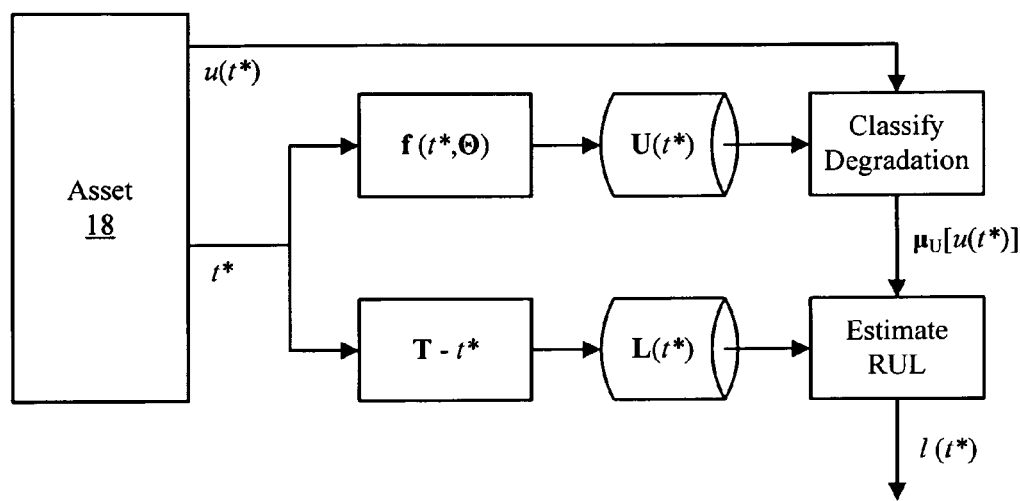
FIG. 19 is a general functional flow diagram detailing an embodiment of a vector analysis procedure of the path classification and estimation (PACE) system and method for prognosticating a capacity remaining useful life (Capacity RUL) and a cycle remaining useful life (Cycle RUL) of a battery asset.

During monitoring or surveillance, the new query observation of the degradation signal at time t* is written as u(t*). Given the degradation signal at a time t*, the general process for estimating the RUL can be seen to be composed of three steps as shown in FIG. 19.

First, the present time t* is used to estimate the expected values of the degradation signal and RULs according to the exemplar paths. In equation form, the expected values of the degradation signal according to the exemplar paths are the approximating functions evaluated at the present time t*.

$$f(t^*, \Theta) = \begin{bmatrix} f_1(t^*, \theta_1) \\ f_2(t^*, \theta_2) \\ f_3(t^*, \theta_3) \\ f_4(t^*, \theta_4) \end{bmatrix} \quad (E1)$$

The function evaluations can be interpreted as exemplars of the degradation signal at time t*. In this context, the above vector can be rewritten as follows.

$$U(t^*) = \begin{bmatrix} f_1(t^*, \theta_1) \\ f_2(t^*, \theta_2) \\ f_3(t^*, \theta_3) \\ f_4(t^*, \theta_4) \end{bmatrix} = \begin{bmatrix} U_1(t^*) \\ U_2(t^*) \\ U_3(t^*) \\ U_4(t^*) \end{bmatrix} \quad (E2)$$

At the same time, the present time t* is used with the vector of failure times to calculate the expected RULs according to the exemplar degradation paths.

$$L(t^*) = T - t^* \begin{bmatrix} T_1 - t^* \\ T_2 - t^* \\ T_3 - t^* \\ T_4 - t^* \end{bmatrix} \quad (E3)$$

Now, the currently observed degradation signal value u(t*) can be compared to the expected degradation signal values U(t*) by any one of a number of classification algorithms (e.g., clustering, nearest neighbor, k-nearest neighbor, non-parametric regression, fuzzy logic, neural networks, et cetera) to obtain a vector of memberships $\mu_U[u(t^*)]$. Here, the memberships have values on [0,1] and $\mu_{U_i}[u(t^*)]$ denotes the membership of u(t*) to the $i^{th}$ exemplar path.

$$\mu_U[u(t^*)] = \begin{bmatrix} \mu_{U_1}[u(t^*)] \\ \mu_{U_2}[u(t^*)] \\ \mu_{U_3}[u(t^*)] \\ \mu_{U_4}[u(t^*)] \end{bmatrix} \quad (E4)$$

Finally, the above memberships and the expected RULs are combined to estimate the present RUL of the individual battery, for example by using a weighted average. Accordingly, PACE can be used perform individual prognosis for battery assets directly based on actual examples of battery degradation to failure.

In one embodiment, the path classification and estimation (PACE) system and method 10 utilizes the above mathematical description for prognosticating the capacity remaining useful life (Capacity RUL) and/or the cycle remaining useful life (Cycle RUL) of at least one observed or in-service battery asset 18.

In-Service Application: Operation and Use

In this work for the United States Navy, we implemented a diagnostic model using a Nonparametric Fuzzy Inference System (NFIS) prediction model in combination with a PACE model to estimate the RUL. The NFIS and PACE model methods were implemented for use in the SURESENSE software product developed and sold by Expert Microsystems of Orangevale, Calif., 95662-2120; (916) 989-2018.

To develop the PACE model, we used battery data representing a series of discharge profiles for varying loads on a military aircraft battery. Since "field" data was not available for the military aircraft battery for typical beginning to end of life operation we interpreted increasing load with increasing wear. In other words, let's take a quick look at the discharge paths of the normalized output voltage presented in FIG. 20, where V is the battery voltage at the test condition and $V_{max}$ is maximum nominal battery voltage value. Here, we see loads that generate normalized output currents of 0.05 $A/A_{max}$, 0.1 $A/A_{max}$, 0.25 $A/A_{max}$, 0.5 $A/A_{max}$, and 1.0 $A/A_{max}$, where A is the output current at the test condition and $A_{max}$ is the maximum output current value tested. What we did is assumed that each of the above paths represent various health states of an individual battery, where increasing output voltage corresponds to increased wear.

PACE was implemented as a prognostic model in Expert Microsystems' SURESENSE software. This prognostic model defines a degradation parameter Degradation to be bound to a degradation signal for calibrating and monitoring. The degradation signal Voltage is bound to the degradation parameter Degradation. The binding is used for both calibrating and monitoring. This PACE instance was used to estimate individual charge remaining useful life. We also used PACE to estimate individual battery remaining useful life.

PACE Calibrating

The PACE prognostic model was then calibrated on 0.05 $A/A_{max}$, 0.25 $A/A_{max}$, and 1.0 $A/A_{max}$ discharge data.

PACE Results

Figures 20, 21:
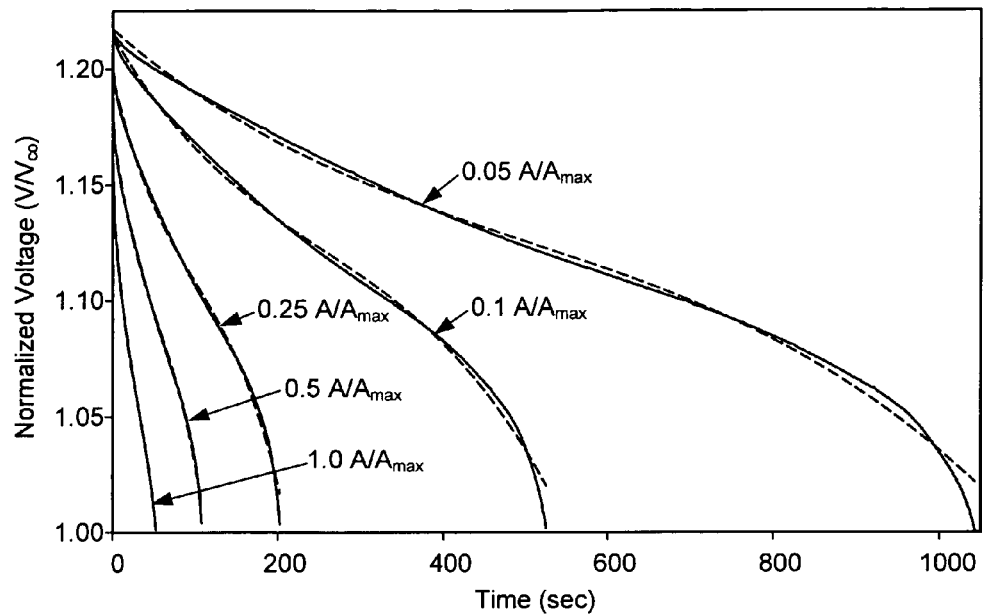
FIG. 20 illustrates a plot of discharge paths of the normalized output voltage of at least one exemplar battery asset and functional approximations of the discharge paths shown by dashed lines.
FIG. 21 illustrates a summary table of the cubic polynomial coefficients used to characterize the functional approximations of the discharge paths shown by dashed lines in FIG. 20.

The PACE test model contains five degradation profiles in five different data sets. The degradation profiles are shown in FIG. 20. For completeness, the cubic polynomial coefficients used to characterize the "shape" of the discharge paths are presented in FIG. 21. We used the calibrated model to estimate the remaining useful life of the individual charge and the individual battery for the 0.1 $A/A_{max}$ and 0.5 $A/A_{max}$ discharge paths, which were not used for model calibration.

Individual Charge RUL

Figure 22:
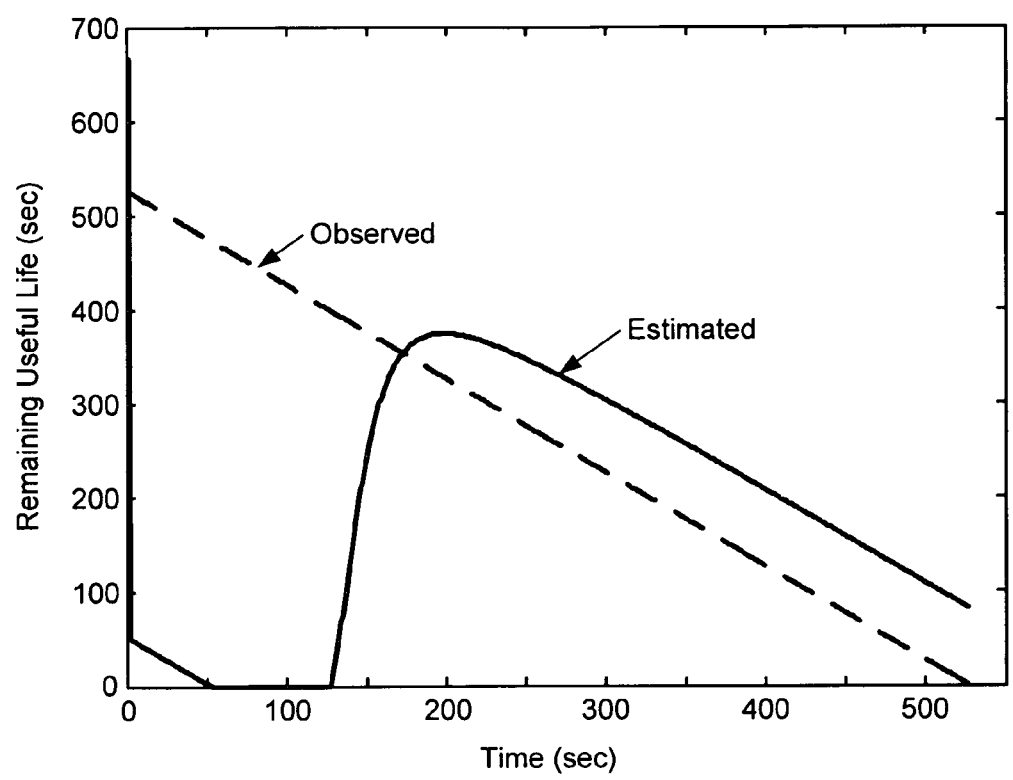
FIG. 22 illustrates a plot of an observed charge RUL and an estimated charge RUL for the 0.1 A/Amax normalized discharge path illustrated in FIG. 20.

In FIG. 22, the observed RUL and the estimated RUL are presented for the 0.1 $A/A_{max}$ discharge path. Initially, the estimated RUL of the charge is far from the actual, but as the discharge continues, it can be seen that around the $200^{th}$ second, the estimate settles off to a value that is slightly larger than the actual RUL. Including the large, initial discrepancies, the mean absolute error (MAE) of the charge RUL was calculated to be 171 seconds or 2.85 minutes. Since the PACE was only calibrated on 3 degradation paths, it is important to note that performance should improve dramatically with additional examples.

Figure 23:
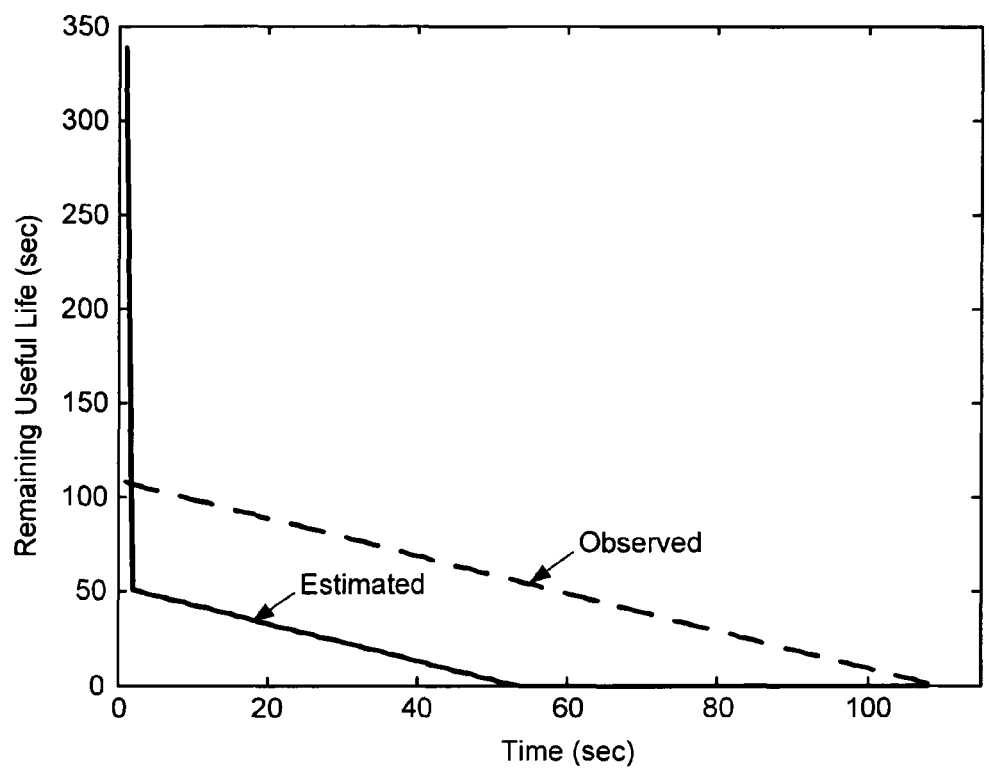
FIG. 23 illustrates a plot of an observed charge RUL and an estimated charge RUL for the 0.5 A/Amax normalized discharge path illustrated in FIG. 20.

The estimates of the charge RUL for the 0.5 $A/A_{max}$ discharge path are presented in FIG. 23. Again, initially the estimates are far from the actual, but around the $5^{th}$ second the estimates decrease sharply to a value that is slightly below the observed value, until it levels off at zero beginning around the $55^{th}$ second. The MAE of the estimates was calculated to be 43.4 seconds or 0.73 minutes. As stated earlier, the performance should improve dramatically as additional discharge paths are added to the PACE memory.

Individual Battery RUL

We used the sum of the output amperage in a discharge cycle as a measure of the battery capacity. The total observed output amperage for the five discharge paths charted in FIG. 20 is presented in FIG. 24, along with the critical failure threshold of 80% of the nominal value. The critical failure threshold is indicated by the dotted line. Here, the nominal value was calculated from the 0.05 $A/A_{max}$ curve and has a value of 48.9 $A/A_{max}$. Finally, for completeness, the values of the total output amperage are presented in a table illustrated in FIG. 25. We create a path for the cumulative sum of the observed current and extrapolate it to determine the time at which it will cross its failure threshold (i.e. 80% of the nominal value).

Extrapolation Procedure

We will now describe the extrapolation done for estimating the RUL of the battery.

Figures 24, 25:
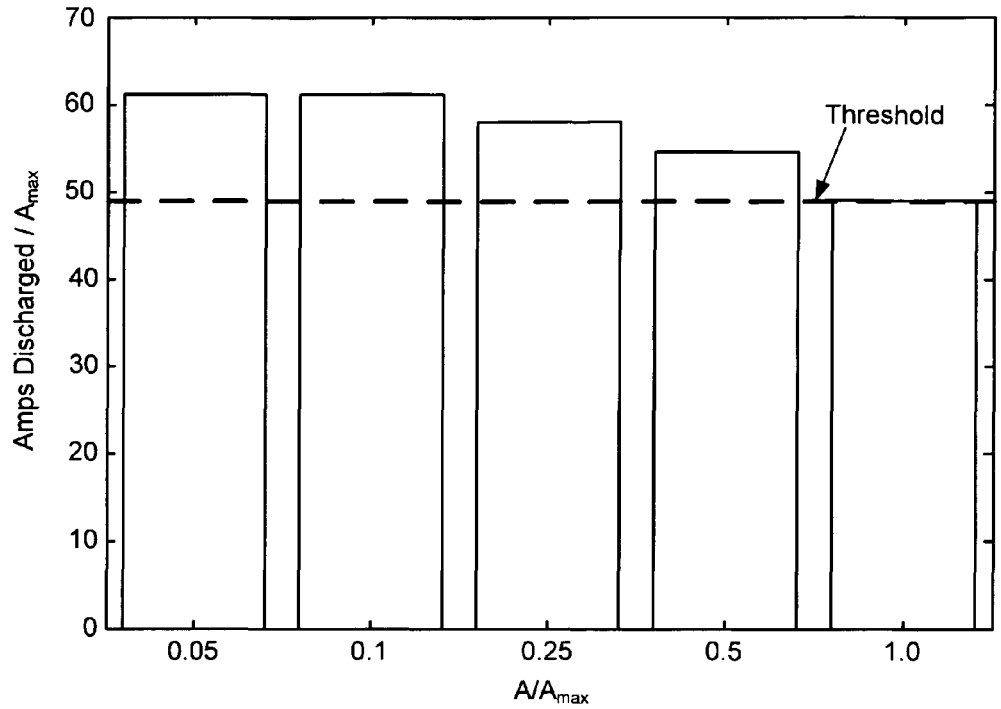
FIG. 24 illustrates a bar graph of total observed output amperage for the five discharge paths illustrated in FIG. 20.
FIG. 25 illustrates a summary table of the normalized values of the output amperage for the five discharge paths illustrated in FIG. 20.

For the 0.1 $A/A_{max}$ discharge path we can see in FIG. 25 that we have two points in the capacity history, specifically 61.1 $A/A_{max}$ and 61.2 $A/A_{max}$. Performing linear regression on the two points results in the following function:

$$A=61.0+0.07N$$

wherein A is the total normalized output amperage and N is the number of discharges:

Notice that the slope is positive. What this means is that for the present set of observations, there is no way to estimate the RUL of the individual battery, in the sense that the estimate produced by the regressed line is infinity, which is not helpful. What we can say is that the battery has not significantly degraded over the two discharges and we can continue to operate normally.

For the 0.5 $A/A_{max}$ discharge path we can see in FIG. 25 that we have four points in the capacity history, specifically 61.1 $A/A_{max}$, 61.2 $A/A_{max}$, 57.9 $A/A_{max}$, and 54.6 $A/A_{max}$.

Performing linear regression on the above history, we get the following equation:

$$A=64.4+2.29N$$

Again, A is the total normalized output amperage and N is the number of discharges.

This time we have a negative slope, which indicates that the battery is degrading. This also means that we can determine the RUL of the battery. To do this we simply find the value of N that produces a total normalized amperage value equal to the previously calculated failure threshold of 48.9 $A/A_{max}$. So let's get started by plugging 48.9 $A/A_{max}$ into the extrapolation function and solve for N.

$$48.9=64.4-2.29N$$

$$N = \frac{48.9 - 64.4}{-2.29} = 6.79$$

What this calculation tells us is that on the $6.79^{th}$ discharge cycle we will need to replace the battery. Now since we are currently on our $4^{th}$ discharge, we can say that the RUL of the battery is 6.79−4=2.79 discharge cycles. For the risk takers, the RUL is 3 discharges; for the conservatives, the RUL is 2 discharges.

Accordingly, and in one aspect, an advantage of the system and method 10 is that it allows longer battery service lives with improved reliability and it prevents premature battery failures in service thereby reducing total sustaining life cycle costs for military aircraft, as well as improving safety.

In another aspect, an advantage of the system and method 10 is that it provides a performance model reference for each fielded battery that is used to verify continuously an individual battery's ongoing capability to meet that aircraft's mission objectives thereby resolving the problem of having to intentionally keep battery service lives short to ensure conservatively that wear-out and failure do not occur in service on-board the aircraft because reliability and availability of military aircraft depends upon the reliability and availability of the battery: a limited life, consumable item.

In another aspect, an advantage of the system and method 10 is that it is flexible enough to dynamically track changes in asset behavior that would result in a marked change in the remaining useful life estimates.

In another aspect, an advantage of the system and method 10 is its flexibility to incorporate physical simulations of degradation and expert opinion into its example data.

In another aspect, the path classification and estimation (PACE) system and method 10 finds application in, but not limited to, Starting, lighting and ignition batteries, for example in Ground vehicles, Air vehicles, and Marine vehicles of all types; Motive and traction batteries, for example in Electric vehicles, Hybrid electric vehicles, Fork lift trucks, Unmanned aerial vehicles, Wheel chairs; and in Electric supply batteries, such as, but not limited to, Space vehicles, Satellites Telemetry systems, Local energy storage, Emergency power, Uninterruptible power supplies, Emergency lighting, Emergency beacons, Implanted medical devices, Power tools, Robotic equipment, Remote relay stations, Communication base stations, Mobile computers, such as laptops and netbooks, Mobile phones, Portable radio and television, Camcorders, and Cameras. Additionally, and in another aspect, the path classification and estimation (PACE) system and method 10 can provide a remaining useful life display gauge and/or alarm to provide one with visual and/or audible state-of-health outputs reflective of the prognostication of the capacity remaining useful life (Capacity RUL) and/or a cycle remaining useful life (Cycle RUL) of the respective battery asset.

Accordingly, it should be apparent that further modifications and adaptations may be resorted to without departing from the scope and fair meaning of the present invention as set forth hereinabove and as described hereinbelow by the claims.

We claim:

1. A computer-implemented method for estimating a remaining useful life of an observed battery asset, comprising the steps of:
   obtaining exemplar degradation data from at least one exemplar battery asset;
   transforming the exemplar degradation data into functional approximations to obtain a plurality of exemplar degradation paths;
   acquiring observed battery asset degradation data from an observed battery asset;
   transforming the observed battery asset degradation data into a functional approximation to obtain an observed battery asset degradation path;
   classifying the observed battery asset degradation data by determining a plurality of similarities each quantifying a degree of similarity of the observed battery asset degradation path to at least one of the plurality of exemplar degradation paths; and
   estimating, with a computer, a remaining useful life of the observed battery asset using the determined plurality of similarities each quantifying the degree of similarity of the observed battery asset degradation path to at least one of the plurality of exemplar degradation paths.

2. The computer-implemented method of claim 1 wherein the exemplar degradation paths are exemplar battery discharge voltage paths.

3. The computer-implemented method of claim 2 wherein the acquired observed battery degradation data is observed discharge voltage data and the observed battery asset degradation path is an observed battery discharge voltage path.

4. The computer-implemented method of claim 3 wherein the estimated remaining useful life is a time for which the observed battery asset can be used for an observed charge.

5. The computer-implemented method of claim 1 wherein the exemplar degradation paths are exemplar battery output amps paths.

6. The computer-implemented method of claim 5 wherein the acquired observed battery degradation data is observed output amps data and the observed battery asset degradation path is an acquired output amps path.

7. The computer-implemented method of claim 6 wherein the estimated remaining useful life is a number of charge/discharge cycles for which the observed battery asset can be used before being replaced.

8. A battery asset surveillance system for estimating a remaining useful life of an observed battery asset, said system comprising:
   means for obtaining exemplar degradation data from at least one exemplar battery asset;
   means for transforming the exemplar degradation data into functional approximations to obtain a plurality of exemplar degradation paths;
   means for acquiring observed battery asset degradation data from an observed battery asset;
   means for transforming the observed battery asset degradation data into a functional approximation to obtain an observed battery asset degradation path;
   means for classifying the observed battery asset degradation data by determining a plurality of similarities each quantifying a degree of similarity of the observed battery asset degradation path to at least one of the plurality of exemplar degradation paths; and
   means for estimating a remaining useful life of the observed battery asset using the determined plurality of similarities each quantifying the degree of similarity of the observed battery asset degradation path to at least one of the plurality of exemplar degradation paths.

9. The system of claim 8 wherein the exemplar degradation paths are exemplar battery discharge voltage paths.

10. The system of claim 9 wherein the acquired observed battery degradation data is observed discharge voltage data and the observed battery asset degradation path is an observed battery discharge voltage path.

11. The system of claim 10 wherein the estimated remaining useful life is a time for which the observed battery asset can be used for an observed charge.

12. The system of claim 8 wherein the exemplar degradation paths are exemplar battery output amps paths.

13. The system of claim 12 wherein the acquired observed battery degradation data is observed output amps data and the observed battery asset degradation path is an acquired output amps path.

14. The system of claim 13 wherein the estimated remaining useful life is a number of charge/discharge cycles for which the observed battery asset can be used before being replaced.

15. A non-transitory computer-readable medium having computer executable instructions for performing a method for estimating a remaining useful life of an observed battery asset, the method comprising the steps of:
   obtaining exemplar degradation data from at least one exemplar battery asset;
   transforming the exemplar degradation data into functional approximations to obtain a plurality of exemplar degradation paths;
   acquiring observed battery asset degradation data from an observed battery asset;
   transforming the observed battery asset degradation data into a functional approximation to obtain an observed battery asset degradation path;
   classifying the observed battery asset degradation data by determining a plurality of similarities each quantifying a degree of similarity of the observed battery asset degradation path to at least one of the plurality of exemplar degradation paths; and
   estimating a remaining useful life of the observed battery asset using the determined plurality of similarities each quantifying the degree of similarity of the observed battery asset degradation path to at least one of the plurality of exemplar degradation paths.

16. The non-transitory computer-readable medium of claim 15 wherein the exemplar degradation paths are exemplar battery discharge voltage paths.

17. The non-transitory computer-readable medium of claim 16 wherein the acquired observed battery degradation data is observed discharge voltage data and the observed battery asset degradation path is an observed battery discharge voltage path.

18. The non-transitory computer-readable medium of claim 17 wherein the estimated remaining useful life is a time for which the observed battery asset can be used for an observed charge.

19. The non-transitory computer-readable medium of claim 15 wherein the exemplar degradation paths are exemplar battery output amps paths.

20. The non-transitory computer-readable medium of claim 19 wherein the acquired observed battery degradation data is observed output amps data and the observed battery asset degradation path is an acquired output amps path.

21. The non-transitory computer-readable medium of claim 20 wherein the estimated remaining useful life is a number of charge/discharge cycles for which the observed battery asset can be used before being replaced.

22. A computer-implemented method for estimating a remaining useful life of an observed battery asset, comprising the steps of:
- obtaining exemplar degradation data from at least one exemplar battery asset;
- approximating the exemplar degradation data using at least one mathematical function to obtain a plurality of exemplar degradation path functions;
- acquiring observed battery asset degradation data from an observed battery asset;
- approximating the observed battery asset degradation data using at least one mathematical function to obtain an observed battery asset degradation path function;
- determining a plurality of similarities each quantifying a degree of similarity of the observed battery asset degradation path function to at least one of the plurality of exemplar degradation path functions; and
- estimating, with a computer, a remaining useful life of the observed battery asset using the determined plurality of similarities each quantifying the degree of similarity of the observed battery asset degradation path function to at least one of the plurality of exemplar degradation path functions.

23. A battery asset surveillance system for estimating a remaining useful life of an observed battery asset, said system comprising:
- means for obtaining exemplar degradation data from at least one exemplar battery asset;
- means for approximating the exemplar degradation data using at least one mathematical function to obtain a plurality of exemplar degradation path functions;
- means for acquiring observed battery asset degradation data from an observed battery asset;
- means for approximating the observed battery asset degradation data using at least one mathematical function to obtain an observed battery asset degradation path function;
- means for determining a plurality of similarities each quantifying a degree of similarity of the observed battery asset degradation path function to at least one of the plurality of exemplar degradation path functions; and
- means for estimating a remaining useful life of the observed battery asset using the determined plurality of similarities each quantifying the degree of similarity of the observed battery asset degradation path function to at least one of the plurality of exemplar degradation path functions.

24. A non-transitory computer-readable medium having computer executable instructions for performing a method for estimating a remaining useful life of an observed battery asset, the method comprising the steps of:
- obtaining exemplar degradation data from at least one exemplar battery asset;
- approximating the exemplar degradation data using at least one mathematical function to obtain a plurality of exemplar degradation path functions;
- acquiring observed battery asset degradation data from an observed battery asset;
- approximating the observed battery asset degradation data using at least one mathematical function to obtain an observed battery asset degradation path function;
- determining a plurality of similarities each quantifying a degree of similarity of the observed battery asset degradation path function to at least one of the plurality of exemplar degradation path functions; and
- estimating a remaining useful life of the observed battery asset using the determined plurality of similarities each quantifying the degree of similarity of the observed battery asset degradation path function to at least one of the plurality of exemplar degradation path functions.

\* \* \* \* \*